United States Patent [19]
Patel et al.

[11] Patent Number: 5,606,579
[45] Date of Patent: Feb. 25, 1997

[54] DIGITAL VSB DETECTOR WITH FINAL IF CARRIER AT SUBMULTIPLE OF SYMBOL RATE, AS FOR HDTV RECEIVER

[75] Inventors: Chandrakant B. Patel, Hopewell; Allen L. Limberg, Ringoes, both of N.J.

[73] Assignee: Samsung Electronics Co., Ltd., Kyungki-do, Rep. of Korea

[21] Appl. No.: 247,753

[22] Filed: May 23, 1994

[51] Int. Cl.$^6$ .................................................. H03D 1/24
[52] U.S. Cl. ........................... 375/321; 375/332; 375/350; 375/355
[58] Field of Search .................................. 375/270, 321, 375/329, 332, 350, 340, 344–345, 355; 364/725, 729; 329/300, 304; 348/507, 725, 729, 731, 735

[56] References Cited

U.S. PATENT DOCUMENTS

| | | | |
|---|---|---|---|
| 4,028,626 | 6/1977 | Motley et al. | 375/321 |
| 4,475,220 | 10/1984 | Mattei et al. | |
| 4,803,700 | 2/1989 | Dewey et al. | 375/321 |
| 5,134,634 | 7/1992 | Yoshida | 375/324 |
| 5,227,144 | 6/1993 | Whikehart | 375/261 |
| 5,230,011 | 7/1993 | Gielis et al. | |
| 5,323,425 | 6/1994 | Colamonico et al. | |

FOREIGN PATENT DOCUMENTS 2224410   11/1991   United Kingdom.

OTHER PUBLICATIONS

Charles Rader, "A Simple Method for Sampling In–Phase and Quadrature Components", IEEE, 2384, pp. 821–824, 1984.

D. W. Rice & K. H. Wu, "Quadrature Sampling with High Dynamic Range", IEEE Transactions on Aerospace and Electronic Systems, vol. AES–18, No. 4, Nov. 2382, pp. 736–739, 1982.

Shahid Qureshi, "Timing Recovery for Equalized Partial–Response Systems", IEEE Transactions on Communications, Dec., 2376, pp. 1326–1330, 1976.

*Primary Examiner*—Young T. Tse
*Attorney, Agent, or Firm*—Sughrue, Mion, Zinn, Macpeak & Seas

[57] ABSTRACT

In a radio receiver for receiving vestigial sideband (VSB) signals including symbol codes descriptive of digital signals, HDTV signals being exemplary of such VSB signals, a tuner provides for selecting one of channels at different locations in a frequency band used for transmitting such VSB signals. The tuner also includes mixers for performing plural conversion of the selected channel to a final intermediate-frequency (IF) signal, which is digitized by an analog-to-digital converter. The pilot carrier is detected by a narrowband quadrature-phase synchronous detector operative in the digital regime, for controlling the frequency and phase of the local oscillations applied to one of the mixers in the tuner so that the pilot carrier component of the final IF signal is locked to a submultiple of symbol frequency. The fullband final IF signal is synchronously detected by an in-phase synchronous detector to detect symbol codes. The departures of the actual symbol code levels from the ideal ones are detected by a symbol synchronizer and are used in generating corrections for the phasing of the sampling of the final IF signal when it is digitized by the analog-to-digital converter. The ideal symbol code levels in the fullband final IF signal are inferred from the amplitude of the pilot carrier as detected by a narrowband in-phase synchronous detector operative in the digital regime, for example.

55 Claims, 15 Drawing Sheets

DIGITAL VSB DETECTOR WITH FINAL IF CARRIER AT SUBMULTIPLE OF SYMBOL RATE, AS FOR HDTV RECEIVER

The invention relates to the detection of vestigial sideband information in the digital regime, especially as it relates to digital high-definition television (HDTV) signal radio receivers.

BACKGROUND OF THE INVENTION

Vestigial sideband (VSB) signals that are used in certain transmissions of HDTV signal have their natural carrier wave, which would vary in amplitude depending on the percentage of modulation, replaced by a pilot carrier wave of fixed amplitude, which amplitude corresponds to a prescribed percentage of modulation. This percentage modulation can be made the same as that associated with the smallest change in symbol code level. Such VSB signals will be used in over-the-air broadcasting within the United States, for example, and can be used in cable-casting systems.

Digital HDTV signal radio receivers for these signals have been proposed, which are of a type that uses double-conversion in the tuner followed by synchronous detection. A frequency synthesizer generates first local oscillations that are heterodyned with the received television signals to generate first intermediate frequencies (e.g., with 920 MHz carrier). A passive LC bandpass filter selects these first intermediate frequencies from their image frequencies for amplification by a first intermediate-frequency amplifier, and the amplified first intermediate frequencies are filtered by a first surface-acoustic-wave (SAW) filter that rejects adjacent channel responses. The first intermediate frequencies are heterodyned with second local oscillations to generate second intermediate frequencies (e.g., with 41 MHz carrier), and a second SAW filter selects these second intermediate frequencies from their images and from remnant adjacent channel responses for amplification by a second intermediate-frequency amplifier. The response of the second intermediate-frequency amplifier is synchrodyned to baseband with third local oscillations of fixed frequency.

The third local oscillations of fixed frequency are supplied in 0°- and 90°-phasing, thereby implementing in-phase and quadrature-phase synchronous detection procedures. The in-phase synchronous detection result is eight-level coding of digital symbols when HDTV signals are broadcast, and the quadrature-phase synchronous detection result is nominally zero-valued. Separately digitizing in-phase and quadrature-phase synchronous detection results generated in the analog regime presents problems with regard to the synchronous detection results satisfactorily tracking each other after digitizing; quantization noise introduces pronounced phase errors in the complex signal considered as a phasor. This problem can be avoided in HDTV signal radio receivers of types performing the in-phase and quadrature-phase synchronous detection procedures in the digital regime.

By way of example, the in-phase and quadrature-phase synchronous detection procedures are implemented by sampling the response of the second intermediate-frequency amplifier at twice the Nyquist rate of the eight-level coding when digitizing. The successive samples are considered to be consecutively numbered in order of their occurrence; and odd samples and even samples are separated from each other to generate respective ones of the in-phase (or real) and quadrature-phase (or imaginary) synchronous detection results. The eight-level coding in the digital in-phase synchronous detection result is filtered to remove co-channel interference from NTSC signals and is subjected to equalization filtering. The equalization filter response is supplied as input signal to a trellis decoder. The response of the trellis decoder is supplied as input signal to a data de-interleaver, and the de-interleaved data are supplied to a Reed-Solomon decoder. Error-corrected data are supplied to a data de-randomizer which regenerates packets of data for a packet decoder. Selected packets are used to reproduce the audio portions of the HDTV program, and other selected packets are used to reproduce the video portions of the HDTV program.

Synchrodyning is the procedure of multiplicatively mixing a modulated signal with a wave having a fundamental frequency the same as the carrier of the modulated signal and lowpass filtering the result of the multiplicative mixing to recover the modulating signal at baseband, baseband extending from zero frequency to the highest frequency in the modulating signal. To implement the synchrodyning used in the in-phase and quadrature-phase synchronous detection procedures, the quadrature-phase synchronous detection results are used to develop automatic-frequency-and-phase-control (AFPC) signals for a controlled oscillator that generates the second local oscillations. The digital quadrature-phase synchronous detection result is low-pass filtered to generate an AFPC signal that adjusts the frequency and phase of the second local oscillations to minimize the amplitude of the quadrature-phase synchronous detection result. However, in practice this automatic frequency and phase control has previously been found to be inadequate in providing the desired degree of phase stability for the in-phase synchronous detection result. The adaptive equalization filtering of the digitized in-phase synchronous detection result can correct for static phase error in the synchrodyning used in the in-phase and quadrature-phase synchronous detection procedures, but the adaptive change in the filter coefficients of the equalization filtering is too slow to compensate for phase jitter in the AFPC feedback loop or for changes in phase error that occur during rapid changes in multipath reception of the HDTV signal.

Accordingly, in HDTV signal radio receivers of a type previously proposed, a phase tracker is cascaded with the equalization filtering of the digitized in-phase synchronous detection result. The equalized in-phase synchronous detection result is supplied in digitized form to a Hilbert-transform finite-impulse-response filter. The response of this FIR filter and the equalized in-phase synchronous detection, as delayed to compensate for the latency of the Hilbert-transform FIR filter, are applied as real and imaginary input signals to a complex-number multiplier, to be multiplied by a complex-number multiplier signal for generating a complex-number product. A feedback loop ascertains the departure of the imaginary component of the complex-number product from zero to develop an error signal for adjusting the phase angle of the unit Euler vector used as the complex-number multiplier signal. The real and imaginary values of the unit Euler vector are drawn from a sine/cosine look-up table (LUT) stored in read-only memory (ROM) addressed by the output of an accumulator used for integrating the error signal. A problem with this phase tracker is that the Hilbert-transform FIR filter has to have many, many taps in order to provide the requisite 90° of phase shift at close to zero frequencies.

U.S. patent application Ser. No. 08/237,896 filed on 4 May 1994 and entitled DIGITAL VSB DETECTOR WITH BANDPASS PHASE TRACKER, AS FOR INCLUSION IN AN HDTV RECEIVER, which application is incorporated herein by reference and issued as U.S. Pat. No. 5,479,449 on 26 Dec. 1995. In the modified HDTV signal radio receiver the second local oscillations, which are heterodyned with the first intermediate frequencies to convert them to second intermediate frequencies, are of a fixed frequency. Accordingly, phase jitter in the AFPC feedback loop of a controlled oscillator is eliminated as a problem in the generation of the second local oscillations. The second local oscillations are at a fixed frequency offset from the frequency of the carrier for the second intermediate frequencies. The second local oscillations therefore heterodyne with the first intermediate frequencies to downconvert them to third intermediate frequencies, rather than synchrodyning with the second intermediate frequencies to downconvert them to baseband. The third intermediate frequencies are then digitized with a bandpass, rather than baseband, analog-to-digital converter; and the rest of the detection procedures are carried out in the digital regime. The third intermediate frequencies will still exhibit changes in phase error that occur during rapid changes in multipath reception of the HDTV signal, so a phase tracker is still desirable. The phase tracker is implemented at the third intermediate frequencies during complex synchronous detection, and is therefore implemented before equalization filtering, rather than the phase tracker being implemented after complex synchronous detection and equalization filtering as in the prior-art receiver. The phase tracker is a bandpass phase tracker, rather than the baseband (or lowpass) phase tracker used in the prior-art receiver.

The in-phase and quadrature-phase sampling procedures used in the bandpass phase tracker are adapted from ones previously used for complex synchronous detection of digitized bandpass signals having symmetrical sideband structures. HDTV signals for over-the-air broadcasting are vestigial sideband (VSB) amplitude-modulation signals, rather than double sideband (DSB) amplitude-modulation signals, and have asymmetrical sideband structures. The complex synchronous detection of the HDTV signals, used for developing error signal in the bandpass phase tracker, must be sufficiently restricted in bandwidth that response is to a symmetrical sideband structure contained within the asymmetrical sideband structure of the VSB signal. The synchronous detection of the HDTV signals to recover the eight-level (or 16-level) VSB coding is not so restricted in bandwidth.

The in-phase and quadrature-phase sampling procedures used in the bandpass phase tracker are generally similar to those described by D. W. Rice and K. H. Wu in their article "Quadrature Sampling with High Dynamic Range" on pp. 736–739 of IEEE TRANSACTIONS ON AEROSPACE AND ELECTRONIC SYSTEMS, Vol. AES-18, No. 4 (November 1982), for example. Quadrature-phase synchronous detection is performed using a Hilbert-transform FIR filter on the digitized bandpass signals; in-phase synchronous detection is performed after compensating delay equal to the latency time of the Hilbert-transform FIR filter. Performing complex synchronous detection on digitized bandpass signals has the advantage that the direct components introduced by the mixer are suppressed by the bandpass filter and do not affect digitization. In the complex synchronous detection of digitized VSB signals in bandpass form, the direct component of the complex synchronous detection result arising from the partially suppressed carrier wave is unaffected by the direct components introduced by the mixer. The Hilbert-transform FIR filter only has to provide 90° of phase shift above a megahertz or two, where delay requirements are modest, up to a frequency of seven to eight megahertz. The relatively small ratio between the uppermost response frequency and the lowermost response frequency required of the filter keeps the number of taps required in the filter relatively low.

The in-phase and quadrature-phase sampling procedures used in the bandpass phase tracker are alternatively implemented by other types of paired all-pass digital filters that exhibit a constant $\pi/2$ difference in phase response for the digitized bandpass signals. Such modifications of the HDTV signal radio receiver are described and claimed by C. B. Patel and A. L. R. Limberg in U.S. patent application Ser. No. filed on May 1994 and entitled DIGITAL VSB DETECTOR WITH BANDPASS PHASE TRACKER USING RADER FILTERS, AS FOR USE IN AN HDTV RECEIVER, which application is incorporated herein by reference. C. M. Rader in his article "A Simple Method for Sampling In-Phase and Quadrature Components", IEEE TRANSACTIONS ON AEROSPACE AND ELECTRONIC SYSTEMS, Vol. AES-20, No. 6 (November 1984), pp. 821–824, describes improvements in complex synchronous detection carried out on digitized bandpass signals. Rader replaces the Hilbert-transform FIR filter and the compensating-delay FIR filter of Rice and Wu with a pair of all-pass digital filters designed based on Jacobian elliptic functions and exhibiting a constant $\pi/2$ difference in phase response for the digitized bandpass signals. A preferred pair of such all-pass digital filters has the following system functions:

$H_1(z)=z^{-1}(z^{-2}-a^2)/(1-a^2z^{-2})$ $a^2=0.5846832$ $H_2(z)=-(z^{-2}-b^2)/(1-b^2z^{-2})$ $b^2=0.1380250$

Rader describes filter configurations which oversample the signal and require only two multiplications, one by $a^2$ and one by $b^2$, which Patel and Limberg indicate are suitable for an HDTV signal radio receiver.

In the invention herein described an automatic phase and frequency control (AFPC) signal is developed in the digital circuitry following the analog-to-digital converter and is used to control the frequency and phase of one of the local oscillators in the tuner. This control is effected so as to lock the pilot carrier of the final intermediate-frequency (IF) signal in frequency and phase to a submultiple of the symbol clock frequency. Using a fixed-frequency third local oscillator, and controlling the frequency and phase of the oscillations the second local oscillator provides, is preferred in that alignment of the second IF signal with the second SAW filter can be readily assured. The second SAW filter usually contains traps for adjacent-channel signal components, in which case proper alignment of the second IF signal between these traps is important for preserving its integrity. The symbol clocking is made to exhibit a high degree of frequency stability. Controlling the frequency and phase of one of the local oscillators in the tuner so that the pilot carrier of the final intermediate-frequency (IF) signal is locked in frequency and phase to a submultiple of the symbol clock frequency is advantageous in that the AFPC of the IF signals to remove pilot carrier variations during changes in multipath conditions can correct variations of symbol phasing in the received signals as well. These corrections are made responsive to a pilot signal of appreciable energy that is continuously transmitted. Tracking the changes in pilot phasing is accordingly much more accurate in a short term than attempting to track changes in symbol phasing, in which latter form of tracking the formidable problems of accurately defining inter-symbol transitions on a short-term basis have to be dealt with. Since variations of symbol phasing in the received signals are corrected by correcting pilot phasing, when the pilot carrier is locked in frequency and phase to a submultiple of the symbol clock frequency, the speed-of-tracking requirements on the symbol synchronizer are substantially reduced. By locking the pilot carrier of the final intermediate-frequency (IF) signal in frequency and phase to a submultiple of the symbol clock frequency, the AFPC for correcting pilot error invariably operates to correct dynamic symbol phase error as well, eliminating the need for a separate phase tracker to correct dynamic symbol phase error.

SUMMARY OF THE INVENTION

In a radio receiver for receiving vestigial sideband (VSB) signals including symbol codes descriptive of digital signals, HDTV signals being exemplary of such VSB signals, a tuner provides for selecting one of channels at different locations in a frequency band used for transmitting such VSB signals. The tuner also includes mixers for performing plural conversion of the selected channel to a final intermediate-frequency (IF) signal, which is digitized by an analog-to-digital converter. In such a radio receiver which embodies the invention, the pilot carrier is detected by a narrowband quadrature-phase synchronous detector operative in the digital regime, for controlling the frequency and phase of the local oscillations applied to one of the mixers in the tuner so that the pilot carrier component of the final IF signal is locked to a submultiple of symbol frequency. The fullband final IF signal is synchronously detected by an in-phase synchronous detector to detect symbol codes. The sampling of the final IF signal during its digitization by an analog-to-digital converter is done at a multiple of symbol rate, which symbol rate is detected from the fullband in-phase synchronous detector response. The departures of the actual symbol code levels from the ideal ones are detected by a symbol synchronizer and are used in generating corrections for the phasing of the sampling of the final IF signal when it is digitized by the analog-to-digital converter.

In preferred embodiments of the invention the ideal symbol code levels in the fullband final IF signal are inferred from the amplitude of the pilot carrier, as detected by a narrowband in-phase synchronous detector operative in the digital regime.

In the block schematic diagrams clock or control signal connections are shown in dashed line, where it is desired to distinguish them from connections for the signals being controlled.

DETAILED DESCRIPTION

Figure 1:
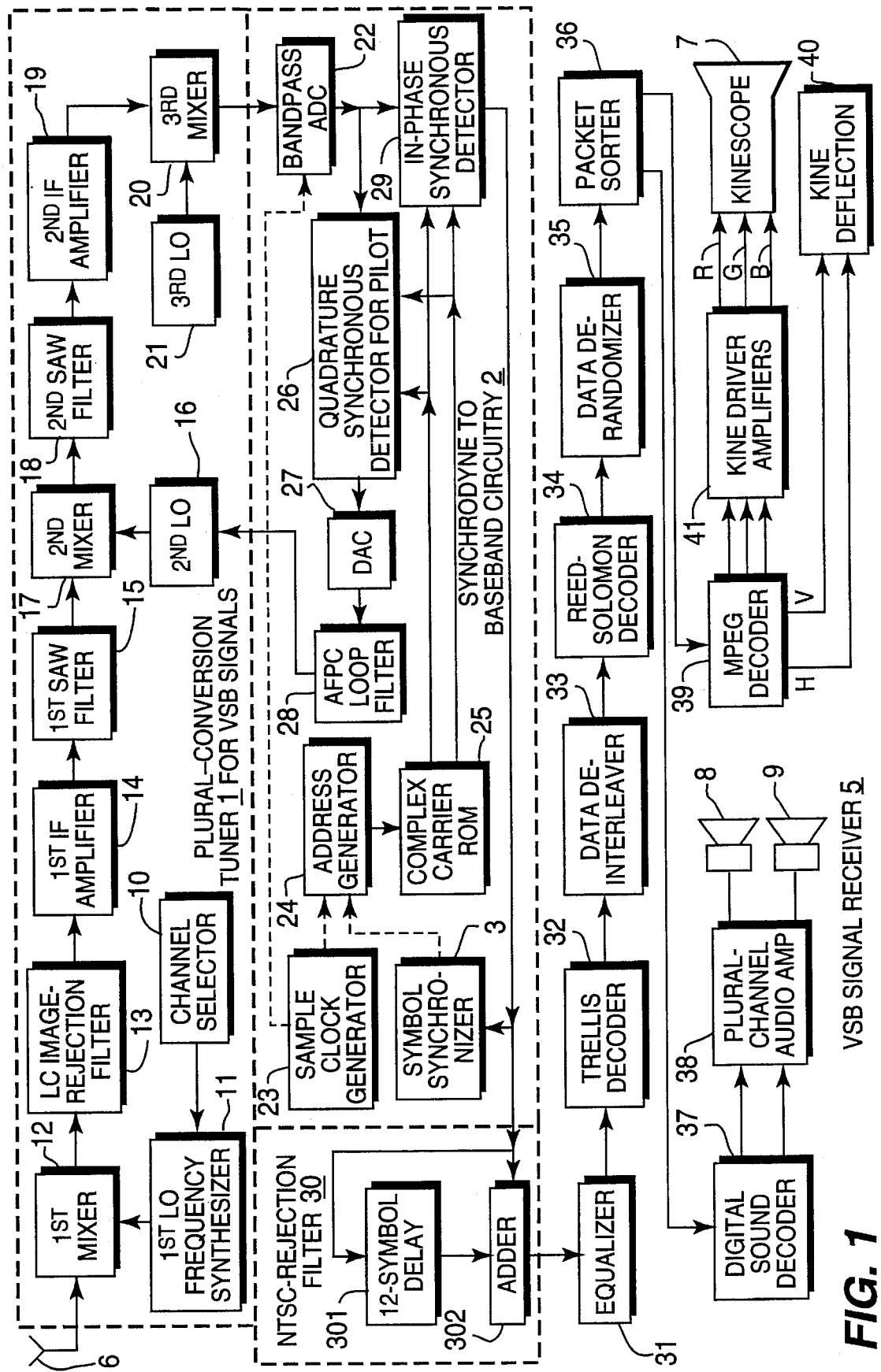
FIG. 1 is a block schematic diagram of a receiver for VSB signal with a pilot carrier component, which receiver uses digital circuitry for synchrodyning symbols to baseband and is of the general type in which the invention may be embodied.

FIG. 1 shows a VSB signal receiver 5 for receiving digital HDTV signals from a broadcast receiving antenna 6. This receiver 5 recovers red (R), green (G) and blue (B) drive signals for a kinescope 7 and recovers stereophonic sound signals for driving left and right loudspeakers 8 and 9. Alternatively, the VSB signal receiver 5 can be connected for receiving digital HDTV signals from a narrowcast receiving antenna or from a cablecast transmission system. A different display device may-be used instead of the kinescope 7, and the sound recovery system may be different, consisting of but a single audio channel or being more elaborate than a simple stereophonic reproduction system.

A tuner 1 comprising elements 11–21 selects one of channels at different locations in the frequency band for the received VSB signals, such as the digital HDTV signals captured by the broadcast receiving antenna 6, and performs plural frequency conversion of the selected channel to a final intermediate-frequency signal in a final intermediate-frequency band. More particularly, a channel selector 10 designed for operation by a human being determines the frequency of first local oscillations that a frequency synthesizer 11, which functions as a first local oscillator, furnishes to a first mixer 12 for heterodyning with received signals as supplied from the broadcast receiving antenna 6 or other digital HDTV signal source. The first mixer 12 upconverts the received signals in the selected channel to prescribed first intermediate frequencies (e.g., with 920 MHz carrier) and an LC filter 13 is used to reject the unwanted image frequencies that accompany the upconversion result supplied from the first mixer 12. The first intermediate frequencies resulting from the upconversion are supplied as input signal to a first intermediate-frequency amplifier 14, which supplies amplified first intermediate frequencies for driving a first surface-acoustic-wave (SAW) filter 15. The upconversion to the rather high-frequency first intermediate frequencies facilitates SAW filtering having a large number of poles and zeroes. Second local oscillations from a second local oscillator 16 are supplied to a second mixer 17 for heterodyning with the response of the first SAW filter 15, to generate second intermediate frequencies (e.g., with 41 MHz carrier). A second SAW filter 18 is used for rejecting the unwanted image frequencies that accompany the upconversion result supplied from the second mixer 17. During the period of transition from NTSC television transmissions to digital television transmissions, the second SAW filter 18 will usually contains traps for sound and video carriers of adjacent-channel NTSC television transmissions. The response of the second SAW filter 18 is supplied as input signal to a second intermediate-frequency amplifier 19, the amplified second intermediate-frequency signal response of which is supplied as input signal to a third mixer 20 there to be heterodyned with oscillations from a third local oscillator 21. The plural-conversion tuner 1 as thusfar described resembles those previously proposed by others, except that the frequency of the oscillations from the third local oscillator 21 is chosen such that the third mixer 20 supplies a third intermediate-frequency signal response with the vestigial sideband extending down to a frequency of one to two MHz and with the full sideband extending up to a frequency of seven to eight MHz, rather than a baseband signal with zero-frequency carrier. The third intermediate-frequency signal differs from that used in the inventors' above-identified previous U.S. patent applications in that the carrier frequency is locked to a submultiple of symbol frequency. The third intermediate-frequency signal response is the final intermediate-frequency output signal of the tuner 1 supplied to circuitry 2 for synchrodyning VSB signals to baseband.

An analog-to-digital converter (ADC) 22 at the input of the circuitry 2 samples the final intermediate-frequency output signal of the tuner 1, the duration of each of the analog samples being no longer than a half cycle of the highest final intermediate frequency so as to avoid undesirable aliasing, and digitizes the samples to digital samples having 10-bit resolution, or so. The lowpass filter that is included, per customary practice, in the ADC 22 suppresses the high-frequency image of the third intermediate-frequency signal response from the third mixer 20. The second SAW filter 18 has already restricted the bandwidth of the third intermediate-frequency signals presented to the ADC 22 to be digitized, so the ADC 22 functions as a bandpass analog-to-digital converter. The sampling rate used by the ADC 22 during digitization is at least the Nyquist rate for the bandwidth of the bandpass signal, which is 6 MHz for HDTV signals. In practice the inventors prefer a sampling rate of twice the symbol rate for the VSB HDTV signals or about $21 \cdot 10^6$ samples per second. A sample clock generator 23 generates the sampling pulses at a nominal 21 MHz rate, which rate is controlled in response to symbol frequency components of the received VSB signal. The sample clock generator 23 preferably includes a crystal oscillator capable of frequency control over a relatively narrow range for generating cissoidal oscillations at a multiple of symbol rate. A symmetrical clipper or limiter generates a square-wave response to these cissoidal oscillations, which is used as clock signal by the ADC 22 as a step in the digitization procedure which follows the initial step of filtering to limit bandwidth. The frequency of the cissoidal generated by the crystal oscillator in the sample clock generator 23 can be determined by an automatic frequency and phase control (AFPC) signal developed in response to symbol frequency components of the received VSB signal, for example, as will be described in detail further on in this specification when describing FIG. 11 of the drawing.

An address generator 24, as will be described in detail further on in this specification, when describing FIG. 11 of the drawing, includes an address counter 241 that counts pulses applied thereto from the sample clock generator 23 as an initial step in generating read-only memory addressing for read-only memory (ROM) 25. The address count from the address counter 241 is combined with a symbol phase correction in a digital adder 243, to generate read-only memory addressing for the ROM 25. The ROM 25 stores sine Φ and cosine Φ functions, where Φ is a radian measure related to address count. The sine Φ and cosine Φ functions concurrently read from the ROM 25 responsive to each sequential address from the address generator 24 are used to construct in-phase and quadrature-phase descriptions of the complex VSB carrier of the final IF signal. Because the frequency of the VSB carrier of the final IF signal is at a submultiple of symbol frequency in a VSB signal receiver embodying the invention, the symbol phase correction exhibits substantially no change from cycle to cycle of the scanning of the read-only memory addresses. This permits AFPC of the VSB carrier of the final IF signal to be done fairly rapidly without the need for symbol phase correction being done at so rapid a rate. That is, the required symbol phase correction is a static correction that adjusts the relative phasing of the VSB carrier of the final IF signal with the submultiple of the sample clock. The symbol phase correction is not required to be a dynamic correction that follows changes in the sample clock timing on an absolute basis. This is why AFPC of the IF signals to remove pilot carrier variations during changes in multipath conditions can correct variations of symbol phasing in the received signals as well, when the VSB carrier of the final IF signal is locked to a submultiple of symbol frequency.

A quadrature-phase synchronous detector 26 synchronously detects, in accordance with the quadrature-phase description of the complex VSB carrier of the final IF signal constructed from ROM 25 read-out, at least the pilot frequency component of the digitized final IF signal supplied to the detector 26 from the ADC 22. The digital output signal from the quadrature-phase synchronous detector 26 is converted to an analog signal by a digital-to-analog converter 27, and the resulting analog signal is lowpass filtered by a lowpass filter 28 to generate an automatic frequency and phase control (AFPC) signal for one of the local oscillators 11, 16 or 21 in the tuner 1. The lowpass filter 28 is sufficiently narrowband that the AFPC signal responds just to least the pilot frequency component of the digitized final IF signal supplied to the detector 26, and the detector 26 may further include narrow bandpass filtering for selecting for synchronous detection just the pilot frequency component of the digitized final IF signal supplied to the detector 26. Preferably, as shown in FIG. 1, the AFPC signal from the filter 28 is applied to the second local oscillator 16 for controlling the frequency and phase of its oscillations. The application of the AFPC signal to one of the local oscillators 11, 16 or 21 in the tuner 1 completes the connections by which the pilot carrier of the final intermediate-frequency (IF) signal is locked in frequency and phase to a submultiple of the symbol clock frequency.

An in-phase synchronous detector 29 synchronously detects, in accordance with the in-phase description of the complex VSB carrier of the final IF signal constructed from ROM 25 read-out, the digitized final IF signal supplied to the detector 29 from the ADC 22. The detector 29 supplies a fullband response to the VSB signal, as the baseband response of the circuitry 2 for synchrodyning VSB signals to baseband. Details of the construction of the synchrodyne circuitry 2 in accordance with various embodiments of the invention will be described further on in this specification with reference to FIGS. 2, 3, 4, 5, 6, 7, 8 and 9 of the drawing.

Sampling at twice the symbol rate for the VSB HDTV signals is done to accommodate a symbol synchronizer 3 that responds to the samples from the in-phase synchronous detector 29, for synchronizing the sampling by the ADC 22 with the symbol rate, so as to maximize the "eye" response. The symbol synchronizer 3 is of the same general type as S. U. H. Qureshi described for use with pulse amplitude modulation (PAM) signals in his paper "Timing Recovery for Equalized Partial-Response Systems, IEEE Transactions on Communications, December 1976, pp. 1326–1330. More specifically, the symbol synchronization circuitry 3 is of the same general type described by the inventors in their earlier-filed U.S. patent application entitled DIGITAL VSB DETECTOR WITH BANDPASS PHASE TRACKER, AS FOR INCLUSION IN AN HDTV RECEIVER. The symbol synchronizer 3 differs from that in the inventors' earlier application in that it does not operate to control the frequency and phase of oscillations generated in the sample clock generator. As noted above the frequency of these oscillations is controlled by other means. The symbol synchronizer 3 is used instead just to control the relative phasing of the sampling of the ADC 22 with respect to the complex carrier wave read from the ROM circuitry 25. As will be described in detail further on in this specification, when describing FIG. 11 of the drawing, the address generator 24 can include, in addition to the address counter 241, a digital adder 243 for combining the integrated-over-time phase error signal generated by the symbol synchronizer 3 with the address count from the address counter 241, thus to generate the addresses for the ROM 25. This procedure permits precise phase adjustment of the sine Φ and cosine Φ functions concurrently read from the ROM 25.

The baseband response of the synchrodyne circuitry 2 is supplied to an NTSC-rejection filter 30 for suppressing co-channel interference from NTSC signals, to be applied as input signal to a clocked delay line 301 and as a first summand input signal to a two-input digital adder 302. The clocked delay line 301 supplies a response to its input signal after a delay equal to twelve symbol epochs, which delayed response is applied to the digital adder 302 as its second summand input signal. The clocked delay line 301 and the digital adder 302 in the NTSC-rejection filter 30 cooperate so as to suppress co-channel interference from NTSC signals. The NTSC-rejection filter 30, which is a comb filter, is required as long as NTSC signals are being transmitted over the same channel allocations as digital HDTV signals. The filter 30 suppresses the NTSC luminance carrier and its lower-frequency sidebands containing synchronizing information, very strongly rejects the color subcarrier, suppresses the chrominance sidebands, and suppresses the FM audio carrier. The filter 30 supplies a fifteen-coding-level signal to an equalizer 31 in response to the eight-coding-level digital in-phase synchronous detection result from the detector 23. Though not explicitly shown the input signal to the equalization filter 31 is decimated 2:1 to reduce sample rate to symbol rate. The equalization filter response is supplied from the equalizer 31 as input signal to a trellis decoder 32, which performs the symbol decoding that recovers the digital data stream. The equalizer 31 provides equalization filtering that generates an adjusted amplitude response to the plural-level coding as applied to the trellis decoder 32, which adjusted amplitude response minimizes symbol error resulting from inter-symbol interference.

Although not explicitly shown in FIG. 1, preferably circuitry is provided in the VSB signal receiver 5 to sense when there is co-channel interference from NTSC signal, to by-pass the filter 30 when no co-channel interference from NTSC signal is sensed, and to adjust symbol decoding ranges in accordance with the number of coding levels to be expected. There is less likelihood of the occurrence of erroneous decisions as to symbol identity when eight coding levels have to be discerned than when fifteen coding levels have to be discerned. Although data synchronization circuitry is not explicitly shown in FIG. 1, one skilled in the digital HDTV art will understand that the VSB signal receiver 5 includes circuitry for determining when data fields and data lines occur to provide the basis for timing data de-interleaving. Data field synchronization circuitry takes its input signal from the output port of the equalizer 31, supposing the equalizer 31 is of the type preferred by the inventors, which type makes feedback adjustments of amplitude response dependent on the response of the equalizer 31 to a ghost-cancellation reference signal. The beginning of data fields are signaled by a pseudo-random pulse train that serves as a ghost-cancellation reference signal for the equalizer 31. Data line synchronization circuitry that detects the occurrences of the symbol code sequence signaling the beginning of data lines as they occur in the equalizer 31 response, rather than as they occur in the equalizer 31 input signal, is preferred by the inventors. Such data line synchronization circuitry can use the same circuitry for deciding coding levels as the trellis decoder 32 uses for symbol decoding.

The data response of the trellis decoder 32 is supplied as input signal to a data de-interleaver 33, and the de-interleaved data are supplied from the data de-interleaver 33 to a Reed-Solomon decoder 34. Error-corrected data are supplied from the Reed-Solomon decoder 34 to a data de-randomizer 35 which regenerates packets of data for a packet sorter 36. The packet sorter 36 sorts packets of data for different applications, responsive to header codes in the successive packets of data. Packets of data descriptive of the audio portions of the HDTV program are applied by the packet sorter 36 to a digital sound decoder 37. The digital sound decoder 37 supplies left-channel and right-channel stereophonic sound signals to a plural-channel audio amplifier 38 that drives the plurality of loudspeakers 8, 9. Packets of data descriptive of the video portions of the HDTV program are applied by the packet sorter 36 to an MPEG decoder 39. The MPEG decoder 39 supplies horizontal (H) and vertical (V) synchronizing signals to kinescope deflection circuitry 40 that provides for the raster scanning of the viewing screen of the kinescope 7 or other display device. The MPEG decoder 39 also supplies signals to the kinescope driver amplifiers 41 for applying amplified red (R), green (G) and blue (B) drive signals to the kinescope 7 or other display device.

Figure 2:
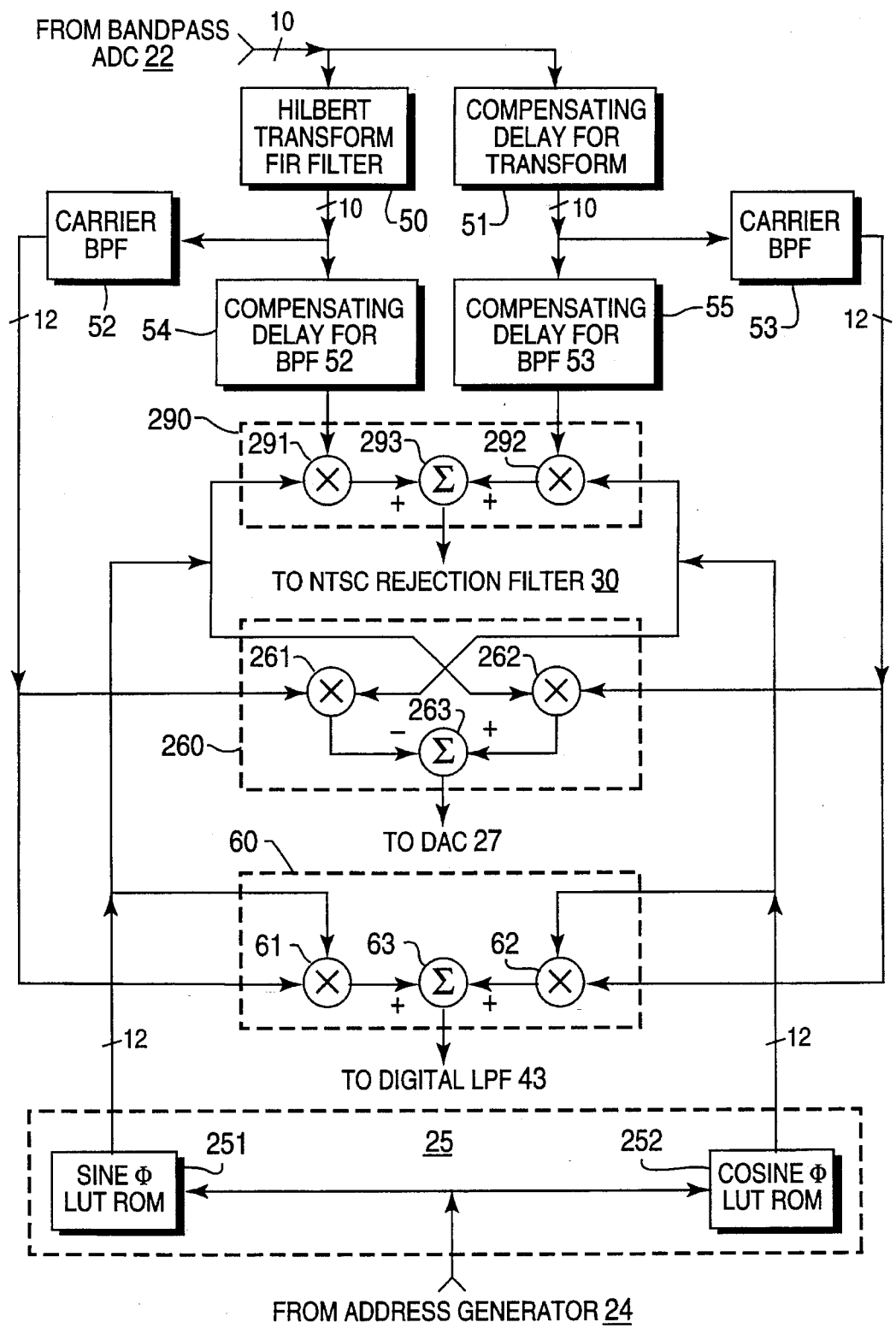
FIGS. 2, 3, 4, 5, 6, 7, 8 and 9 are block schematic diagrams of different configurations that the digital circuitry for synchrodyning symbols to baseband takes in the FIG. 1 VSB receiver in various specific embodiments of the invention.

FIG. 2 shows the form portions of the synchrodyne circuitry 2 take in a first embodiment of the invention. FIG. 2 depicts a particular species 260 of the in-phase synchronous detector 26 shown generically in FIG. 1; and FIG. 2 further depicts a particular species 290 of the quadrature-phase synchronous detector 29 shown generically in FIG. 1. The digitized final IF signal from the analog-to-digital converter 22 is supplied as input signal to an FIR digital filter 50 providing a Hilbert transform of the third mixer 20 response. The digitized final IF signal from the ADC 22 is also supplied as input signal to a digital delay line 51, which delay line 51 provides compensating delay equal to the latency of the digital filter 50. The responses of the digital filter 50 and of the digital delay line 51 are supplied as input signals to carrier bandpass filters 52 and 53, respectively. The filters 52 and 53, which have identical bandpass characteristics, separate the complex pilot carrier wave from the sidebands of the carrier wave modulated in accordance with the 8-level VSB coding in the complex signal formed by the responses of the digital filter 50 and of the digital delay line 51. The responses of the digital filter 50 and of the digital delay line 51 are supplied as input signals to digital delay lines 54 and 55, which provide respective compensating delays equal to the latency times of carrier bandpass filters 52 and 53, respectively.

The complex carrier ROM 25 is shown in FIG. 2 to include a component ROM 251, which stores a carrier wave sine Φ look-up table for supplying 12-bit multiplicands to the digital multipliers 262 and 291, and to include a component ROM 252, which stores a carrier wave cosine Φ look-up table for supplying 12-bit multiplicands to the digital multipliers 292 and 261. The plural-conversion tuner 1 preferably heterodynes the carrier of the VSB signal to the lower-frequency portion of the band of final IF signal frequencies supplied to the ADC 22, rather than the higher-frequency portion of that band, because the sine Φ and cosine Φ multiplicands are then supplied from the ROMs 251 and 252 with a greater number of samples per 2π radians of Φ, which provides higher angular resolution in the consecutive carrier wave samples. A number of tricks relying on symmetries in the sine and cosine functions are known to skilled digital designers for reducing the amount of ROM required for sine Φ and cosine Φ table look-up, and the ROM circuitry 25 can be modified to use such reduced-ROM designs. Arrangements where the sine Φ and cosine Φ signals are not read from ROM, but rather are accumulated in parallel in accordance with the sin (A+B)=sin A cos B+cos A sin B and cos (A +B)=cos A cos B−sin A sin B trigonometric formulae are another alternative for generating the complex carrier wave.

The quadrature-phase synchronous detector 260 comprises digital multipliers 261 and 262 for multiplying the responses of the carrier bandpass filters 52 and 53 by the cosine and the sine of the carrier wave, respectively, and a digital subtractor 263 for subtracting the product signal of the digital multiplier 261 from the product signal of the digital multiplier 262. That is, the complex digital description of separated pilot carrier wave furnished by the carrier bandpass filters 52 and 53 is multiplied by the complex digital description of the quadrature-phase carrier wave. Since it is known in advance that the real term of the complex product will invariably be zero-valued, or substantially so, the digital multipliers and adder that would be required to generate the real term are dispensed with. The difference output signal from the subtractor 263 provides an unfiltered digital AFPC signal for application to the DAC 27. The application of the unfiltered digital AFPC signal to the DAC 27 may be a direct one, made by simple wired connection for each bit of the digital difference from the subtractor 263, or it can include some digital filtering, such as circuitry for averaging samples over time.

The in-phase synchronous detector 290 for the complex signal supplied from the digital delay lines 54 and 55 comprises digital multipliers 291 and 292 for multiplying the responses supplied from the delay lines 54 and 55 by the sine and the cosine of the carrier wave, respectively, and a digital adder 293 for summing the product signals from the digital multipliers 291 and 292. Since it is known in advance that the imaginary term of the complex product will invariably be zero-valued, or substantially so, the digital multipliers and subtractor that would be required to generate the imaginary term are dispensed with. The in-phase synchronous detector 290 output signal, which is supplied as the sum signal from the adder 293, is applied to the NTSC-rejection filter 30 as its input signal.

Another in-phase synchronous detector 80 just for the complex pilot carrier wave comprises digital multipliers 61 and 62 for multiplying the responses of the carrier bandpass filters 52 and 53 by the sine and the cosine of the locally generated carrier wave, respectively, and a digital adder 63 for summing the product signals from the digital multipliers 61 and 62. Since it is known in advance that the imaginary term of the complex product will invariably be zero-valued, or substantially so, the digital multipliers and subtractor that would be required to generate the imaginary term are dispensed with. The narrowband in-phase synchronous detector 60 output signal is available for averaging to generate a DC in-phase synchronous detection result, as will be described in detail further on in this specification with reference to FIG. 12 of the drawing.

Figure 3:
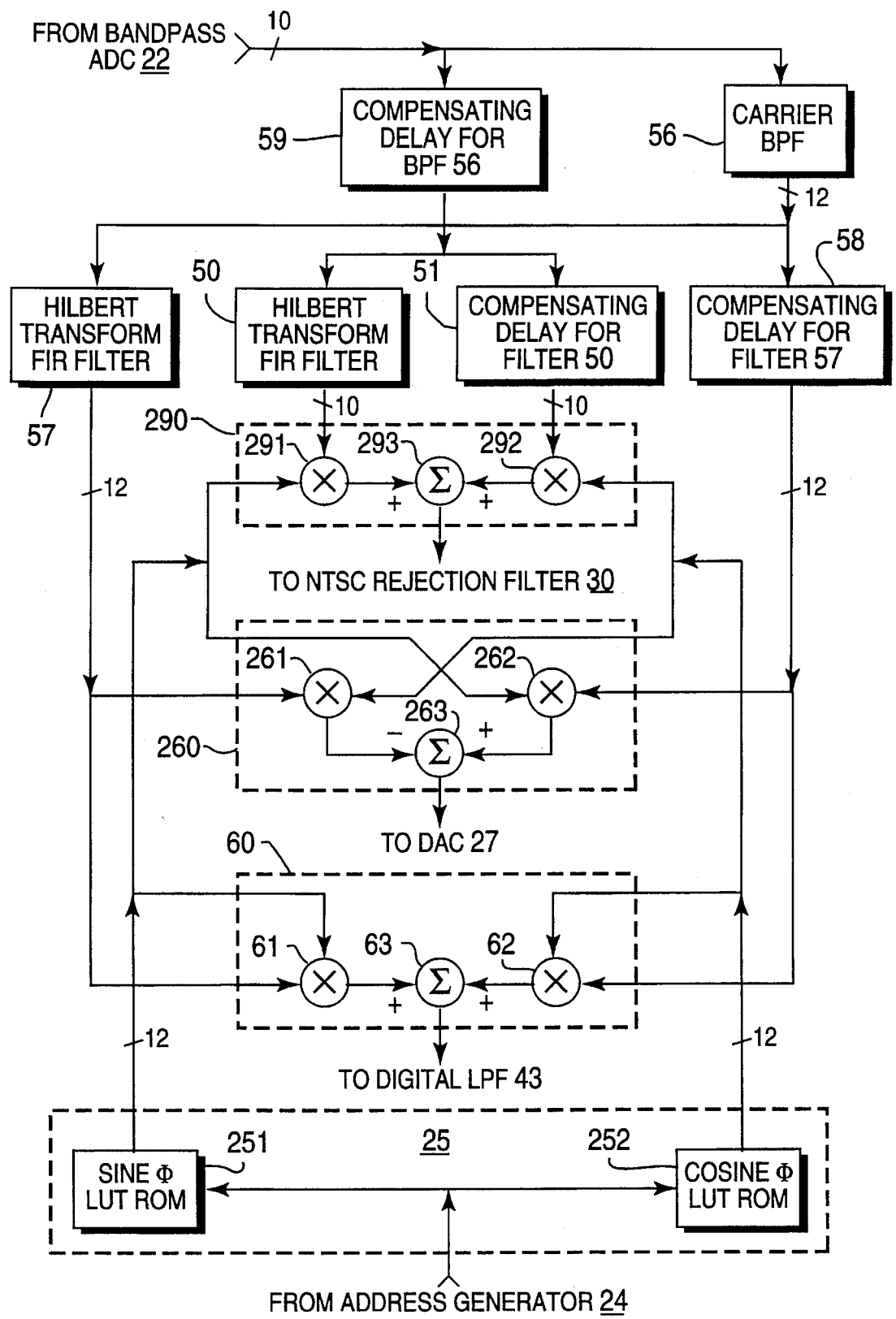

FIG. 3 shows the form portions of the synchrodyne circuitry 2 take in a second embodiment of the invention, which form differs from that shown in FIG. 2 in the following respects. The narrowband carrier bandpass filters 52 and 53 are dispensed with, in favor of a single narrowband carrier bandpass filter 56 receiving the digitized final IF signal from the ADC 22 as its input signal and selecting a digitized carrier wave therefrom for its response. The filter 58 response is supplied as input signal to an FIR digital filter 57 providing a Hilbert transform of the filter 58 response. The filter 58 response is also supplied as input signal to a digital delay line 58, which provides compensating delay equal to the latency of the digital filter 56. The connections to the quadrature-phase synchronous detector 260 are altered so that the digital multipliers 261 and 262 multiply the responses of the digital filter 57 and of the digital delay line 58, respectively, rather than the responses of the carrier bandpass filters 52 and 53.

A delayed response to the digitized final IF signal from ADC 22, which delayed response is supplied by a digital delay line 59, is applied as input signal to the FIR digital filter 50 and to the digital delay line 51. The connections to the full-band in-phase synchronous detector 260 are altered so that the responses of the FIR digital filter 50 and the digital delay line 51 are applied directly to the digital multiplier 291 and to the digital multiplier 292 as their respective multiplicand signals. The digital delay line 59 provides compensating delay for the latency of the carrier bandpass filter 56 in the responses of both the filter 50 and the delay line 51. The single delay line 59 in cascade connection before the filter 50 and the delay line 51 provides the same responses as the two delay lines 54 and 55 connected in respective cascade connections after the filter 50 and the delay line 51, per FIG. 2, do.

The connections to the narrowband in-phase synchronous detector 60 are altered so that the digital multipliers 61 and 62 multiply the responses of the digital filter 57 and of the digital delay line 58, respectively, rather than the responses of the carrier bandpass filters 52 and 53.

Figure 4:
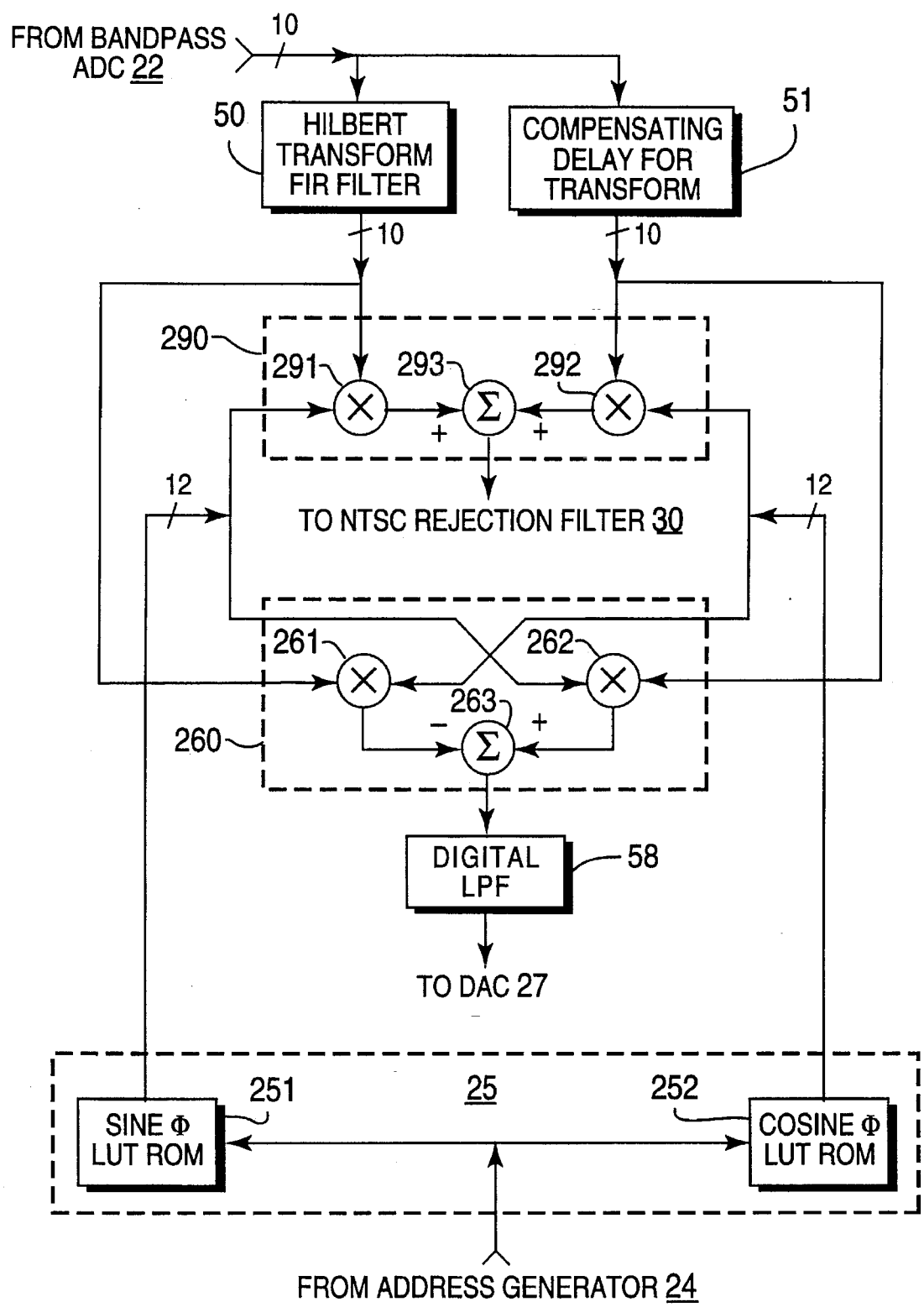

FIG. 4 shows the form portions of the synchrodyne circuitry 2 take in a third embodiment of the invention, which form differs from that shown in FIG. 2 in the following respects. The carrier bandpass filters 52 and 53 are each replaced by a respective wired connection. The digital delay lines 54 and 55, which provide respective compensating delays equal to the latency times of carrier bandpass filters 52 and 53 in FIG. 2, are each replaced by a respective wired connection. The quadrature-phase synchronous detector 260 is operated relatively wideband, with the AFPC signal attributable to the carrier wave being heterodyned to zero or close-to-zero frequency being selected from the sum output signal of the adder 263 using a low-pass digital filter 58. The low-pass filter 58 is chosen to have a cut-off frequency many times lower than symbol rate, so that frequencies associated with groups of successive similar symbols are rejected. The randomization of data as a preliminary step before symbol coding at the transmitter limits the number of successive similar symbols likely to occur, which facilitates lowpass filtering after quadrature-phase synchronous detection to recover AFPC signal. The randomization of data also facilitates bandpass filtering before quadrature-phase synchronous detection to recover AFPC signal per FIG. 2 or 3.

Figure 5:
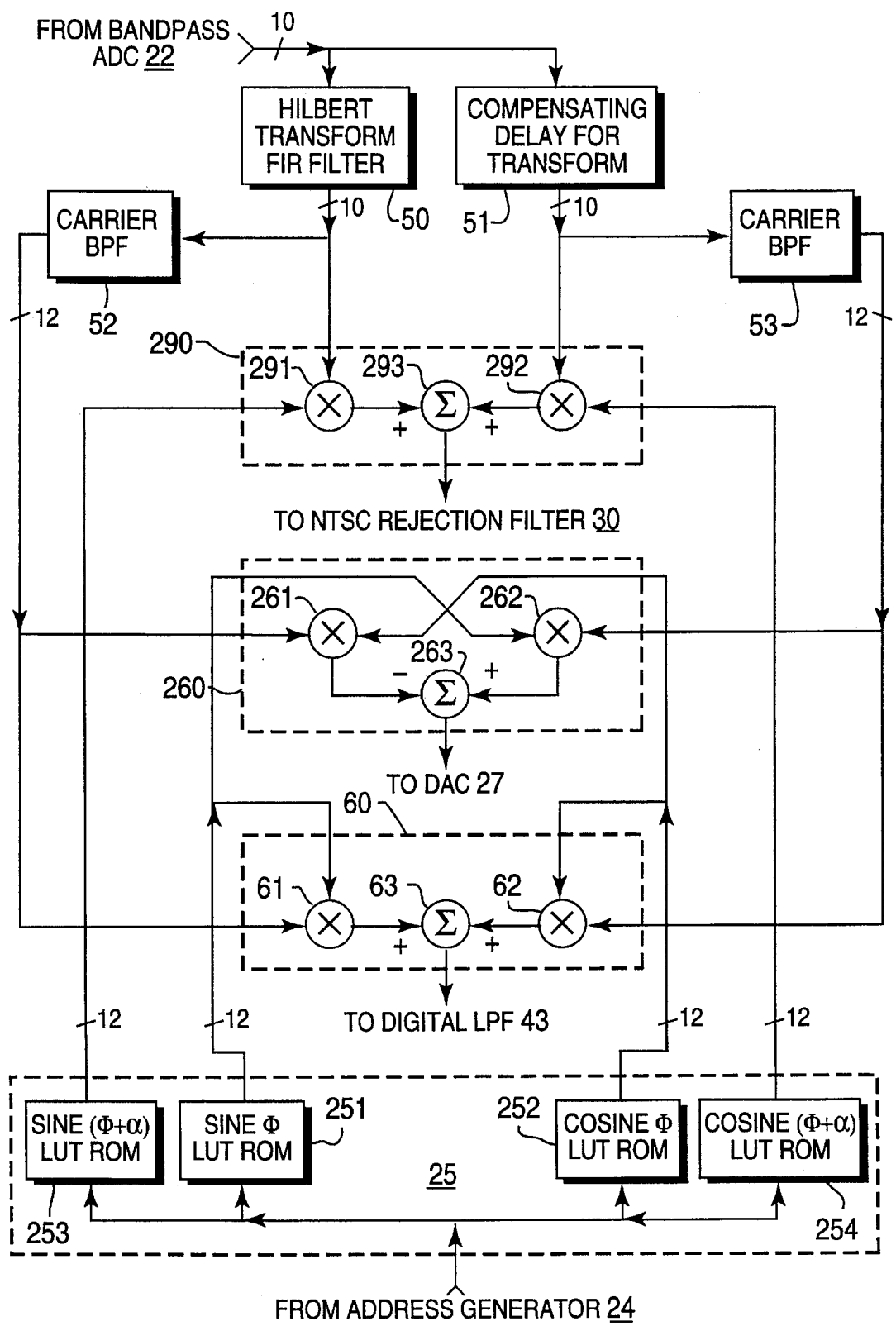

FIG. 5 shows the form portions of the synchrodyne circuitry 2 take in a fourth embodiment of the invention, which form differs from those shown in FIGS. 2 and 3 in the following respects. The ROM circuitry 250 differs from the ROM circuitry 25 in that it further includes another component read-only memory 253 storing a sin ($\Phi+\alpha$) look-up table and still another read-only memory 254 storing a cos ($\Phi+\alpha$) look-up table. The digital multiplier 291 receives its multiplier signal from the ROM 253, rather than from the ROM 251; and the digital multiplier 292 receives its multiplier signal from the ROM 254, rather than from the ROM 252. The digitized final IF signal from the ADC 22 is applied, via a wired connection without substantial delay, as input signal to the Hilbert transform FIR filter 50; and the response of the filter 50 is applied, via a wired connection without substantial delay, to the digital multiplier 291 as its multiplicand input signal. The digitized final IF signal from the ADC 22 is applied, via a wired connection without substantial delay, as input signal to the digital delay line 51; and the response of the delay line 51, via a wired connection without substantial delay, to the digital multiplier 291 as its multiplicand input signal.

That is, FIG. 5 differs from FIG. 2 in that the delay lines 54 and 55 are replaced by respective wired connections. Instead of using the delay lines 54 and 55 for delaying the multiplicand signals applied to the digital multipliers 291 and 292, the multiplicand signals are advanced in time by taking them from the sin ($\Phi+\alpha$) and cos ($\Phi+\alpha$) look-up tables stored in the ROMs 253 and 254, rather than from the sin $\Phi$ and cos $\Phi$ look-up tables stored in the ROMs 251 and 252. FIG. 5 differs from FIG. 3 in that the digital delay line 59 is replaced by a wired connection. Instead of using the delay line 59 for delaying the multiplicand signals applied to the digital multipliers 291 and 292, the multiplicand signals are advanced in time by taking them from the sin ($\Phi+\alpha$) and cos ($\Phi+\alpha$) look-up tables stored in the ROMs 253 and 254. In special cases where $\alpha$ is 90°, the ROMs 253 and 254 are not required, of course, since the cos ($\Phi+\alpha$) and sin ($\Phi+\alpha$) values are same as the sin $\Phi$ and cos $\Phi$ values as respectively read from the ROMs 251 and 252.

Figure 6:
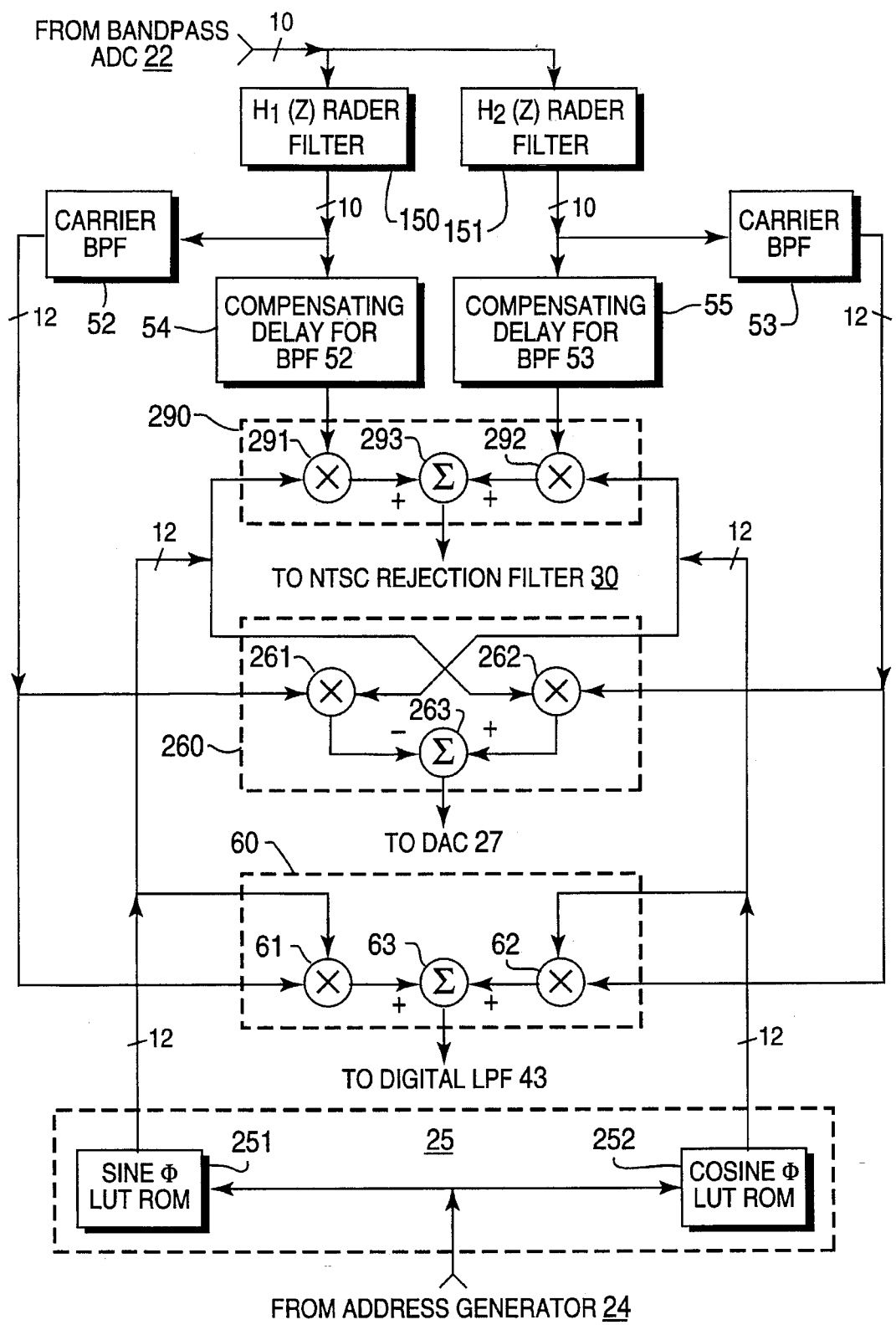

FIG. 6 shows the form portions of the synchrodyne circuitry 2 take in a fifth embodiment of the invention, which form differs from that shown in FIG. 2 in that the digital filter 50 and the digital delay line 51 are replaced by infinite-impulse-response (IIR) digital filters 150 and 151, respectively. The IIR digital filters 150 and 151 respectively provide the $H_1(z)$ and $H_2(z)$ system functions described by C. M. Rader. The responses of the digital filters 150 and 151 are supplied as input signals to carrier bandpass filters 52 and 53, respectively. The filters 52 and 53, which have identical bandpass characteristics, separate the complex pilot carrier wave from the sidebands of the carrier wave modulated in accordance with the 8-level VSB coding in the complex signal formed by the responses of the digital filters 150 and 151. The responses of the digital filters 150 and 151 are supplied as input signals to digital delay lines 54 and 55, which provide respective compensating delays equal to the latency times of carrier bandpass filters 52 and 53, respectively.

Figure 7:
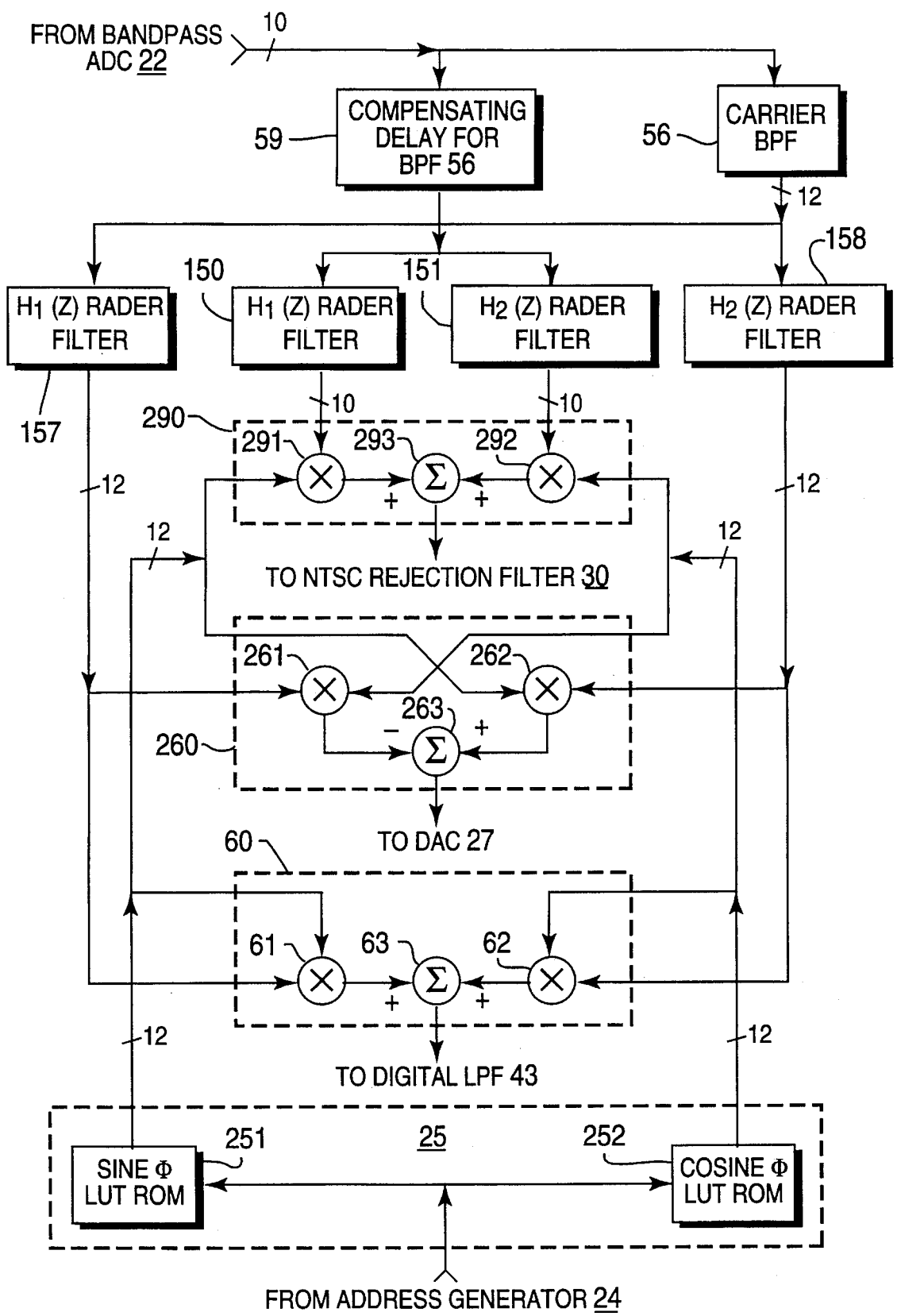

FIG. 7 shows the form portions of the synchrodyne circuitry 2 take in a sixth embodiment of the invention, which form differs from that shown in FIG. 3 in the following respects. The digital filter 50 and the digital delay line 51 are replaced by IIR digital filters 150 and 151, which respectively provide the $H_1(z)$ and $H_2(z)$ system functions described by C. M. Rader. The responses of the digital filters 150 and 151 are supplied as respective multiplicand input signals to the digital multiplier 291 and to the digital multiplier 292 in the fullband digital in-phase synchronous detector 290. The filter 56 response is supplied as a shared input signal to IIR digital filters 157 and 158, which respectively provide the $H_1(z)$ and $H_2(z)$ system functions described by C. M. Rader, for convolution with the filter 56 response. The connections to the quadrature-phase synchronous detector 280 are altered so that the digital multipliers 261 and 262 multiply the responses of the digital filters 157 and 158, respectively, rather than the responses of the carrier bandpass filter 57 and the digital delay line 58. The connections to the narrowband digital in-phase synchronous detector 60 are altered so that the digital multipliers 61 and 62 multiply the responses of the digital filters 157 and 158, respectively, rather than the responses of the carrier bandpass filter 57 and the digital delay line 58.

Figure 8:
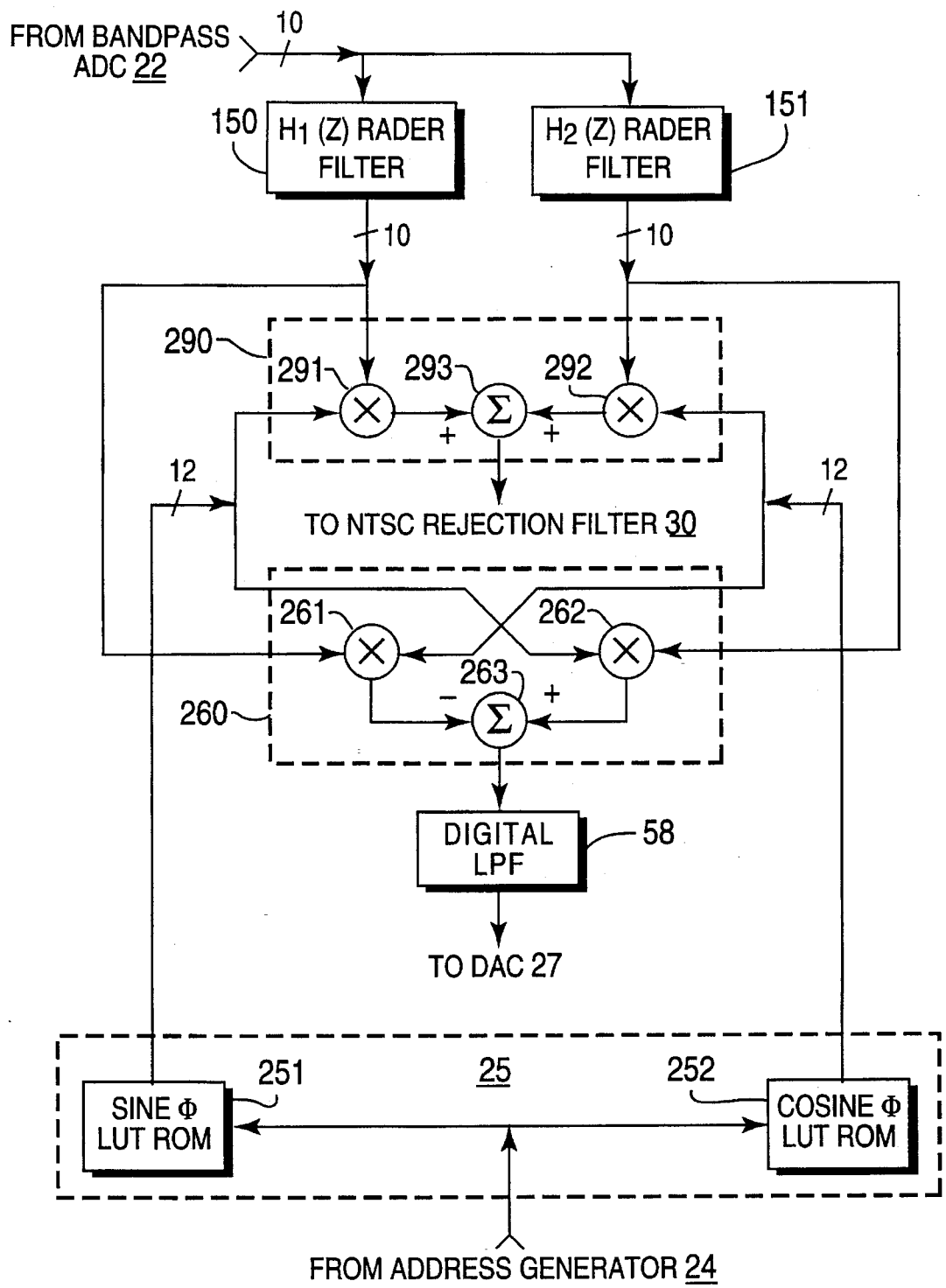

FIG. 8 shows the form portions of the synchrodyne circuitry 2 take in a seventh embodiment of the invention, which form differs from that shown in FIG. 4 in that the digital filter 50 and the digital delay line 51 are replaced by IIR digital filters 150 and 151, which respectively provide the $H_1(z)$ and $H_2(z)$ system functions described by C. M. Rader.

Figure 9:
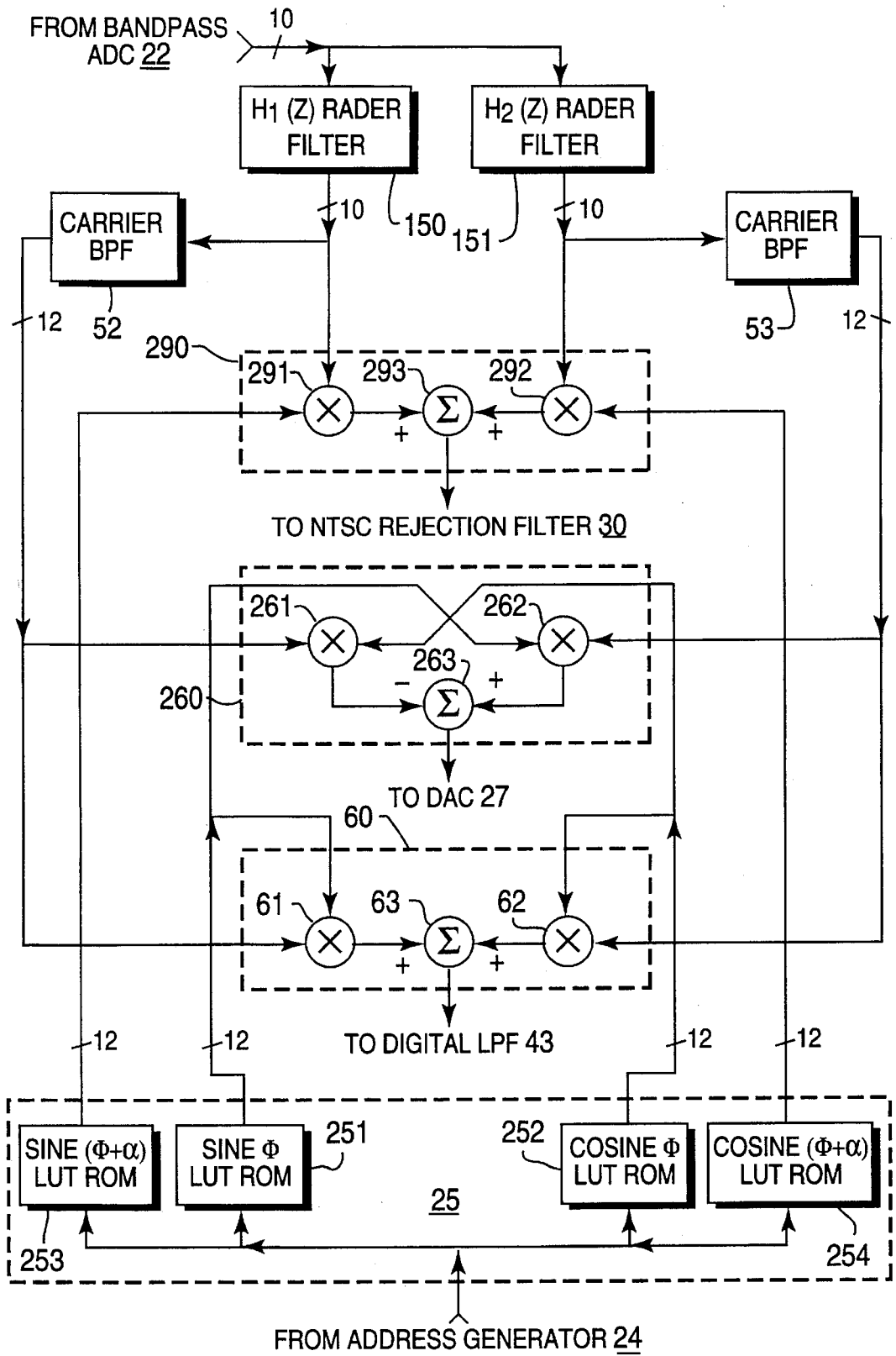

FIG. 9 shows the form portions of the synchrodyne circuitry 2 take in a eighth embodiment of the invention, which form differs from that shown in FIG. 5 in that the digital filter 50 and the digital delay line 51 are replaced by IIR digital filters 150 and 151, which respectively provide the $H_1(z)$ and $H_2(z)$ system functions described by C. M. Rader.

Figure 10:
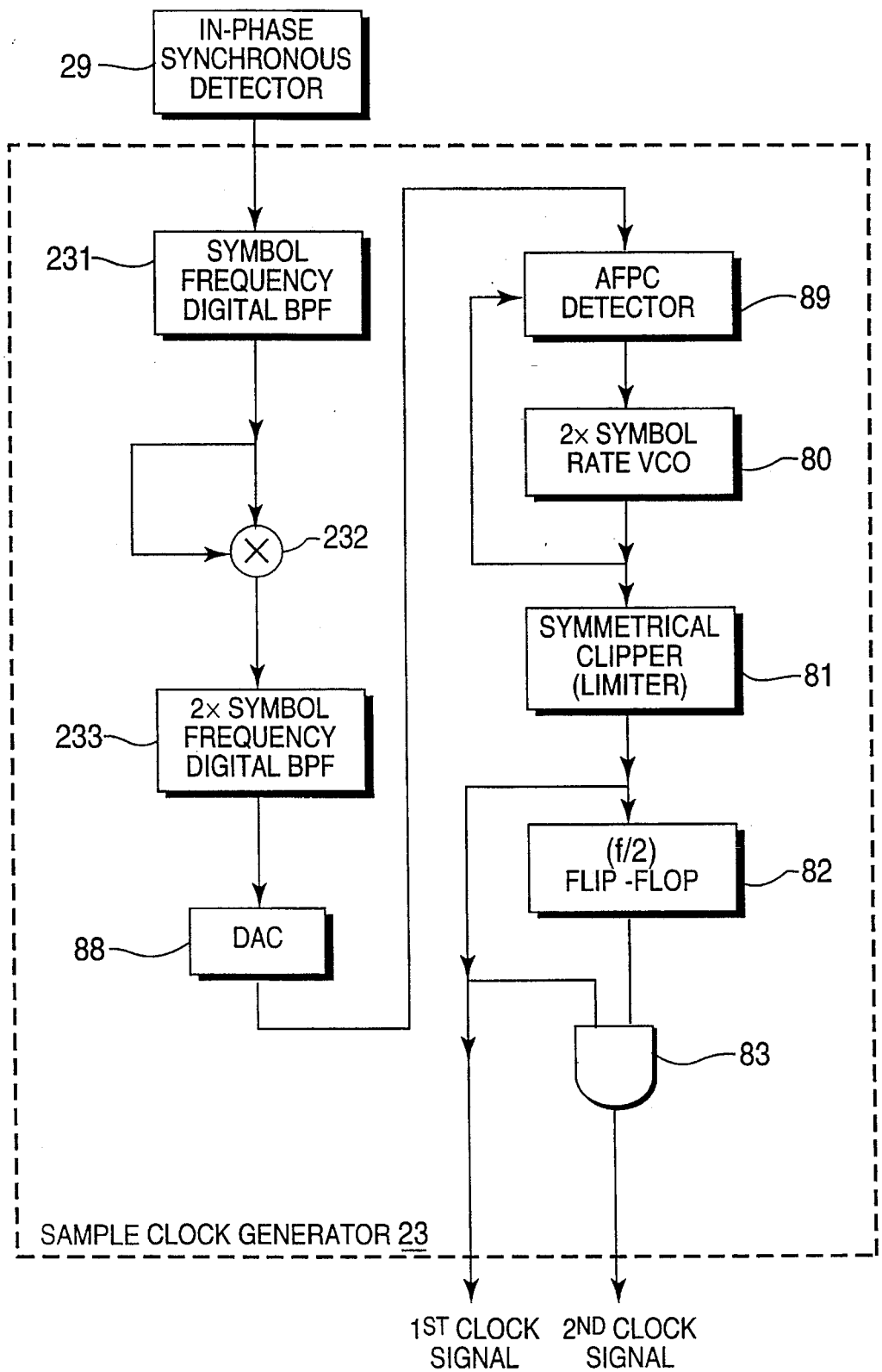
FIG. 10 is a block schematic diagram of a particular form the sample clock generator for the digital circuitry in the FIG. 1 VSB signal receiver takes, the sample clock generator providing for sampling VSB signal, as downconverted to final intermediate frequencies at a submultiple of symbol rate in accordance with the invention.

FIG. 10 shows a particular form the sample clock generator 23 for the digital circuitry in the FIG. 1 VSB signal receiver can take for sampling VSB signal, as downconverted to final intermediate frequencies in which the carrier frequency is at a submultiple of symbol rate in accordance with the invention. A voltage-controlled oscillator 80 generates cissoidal oscillations nominally of 21 MHz frequency. The oscillator 80 is preferably a crystal oscillator capable of frequency control over a relatively narrow range, ±10 Hz or so. A symmetrical clipper or limiter 81 generates a squarewave response to these cissoidal oscillations, which is used as a first clock signal. The first clock signal times the sampling of the final IF signal by the ADC, 22 as a step in the digitization procedure which follows the initial step of filtering to limit bandwidth. A frequency-divider flip-flop 82 responds to transitions of the first clock signal in a prescribed sense for generating another square wave which an AND circuit 83 ANDs with the first clock signal for generating a second clock signal used in the symbol synchronizer 3 and for subsampling the NTSC-rejection filter 30 response 2:1. This 2:1 decimation eliminates the alternate real samples that are nominally zero-valued. The elements 80, 81, 82 and 83 correspond to those elements used in sample clock generators of the VSB receivers described in the inventors' previous applications. The sample clock generator 23 further includes a digital-to-analog converter (DAC) 88, an automatic frequency and phase control detector 89, digital multiplier 232 (or other sample-squaring circuitry) and bandpass digital filters 231 and 233 respectively tuned to the fundamental and the second harmonic of symbol frequency. The cissoidal oscillations from the VCO 80 and a reference 21 MHz carrier supplied from the digital-to-analog converter (DAC) 88 are compared by the AFPC detector 89; and the comparison results are subjected to narrowband lowpass filtering within the AFPC detector 89, to develop an automatic frequency and phase control (AFPC) signal for regulating the frequency of the voltage-controlled oscillator 80 to be exactly twice symbol rate.

FIG. 10 also shows preferred means for controlling the rate of the recurrent pulses in said sample clock signal supplied by the sample clock generator 23. This means, which constitutes elements 231, 232 and 233 in addition to the DAC 88 and the AFPC detector 89, responds to components of said fullband digital in-phase synchronous detection result that are equal to and substantially equal to symbol coding frequency. The reference 21 MHz carrier in digital form that is supplied as input signal to the DAC 88 is generated in response to the strong symbol frequency component of the samples from the fullband in-phase synchronous detector 29, as selected by the bandpass digital filter 231 tuned to the symbol frequency fundamental. The digital multiplier 232 squares the symbol frequency fundamental component selected by the filter 231, and the resulting second harmonic of symbol frequency component is selected by the bandpass digital filter 233 tuned to the second harmonic of the symbol frequency. This selected second harmonic of symbol frequency component is supplied to the DAC 88 for conversion into the reference 21 MHz carrier supplied to the AFPC detector 89. In less preferred embodiments of the invention the voltage-controlled oscillator 80 could be replaced by an injection-locked oscillator into which the reference 21 MHz carrier supplied by the DAC 88 is injected directly for locking the frequency of the oscillations.

Figure 11:
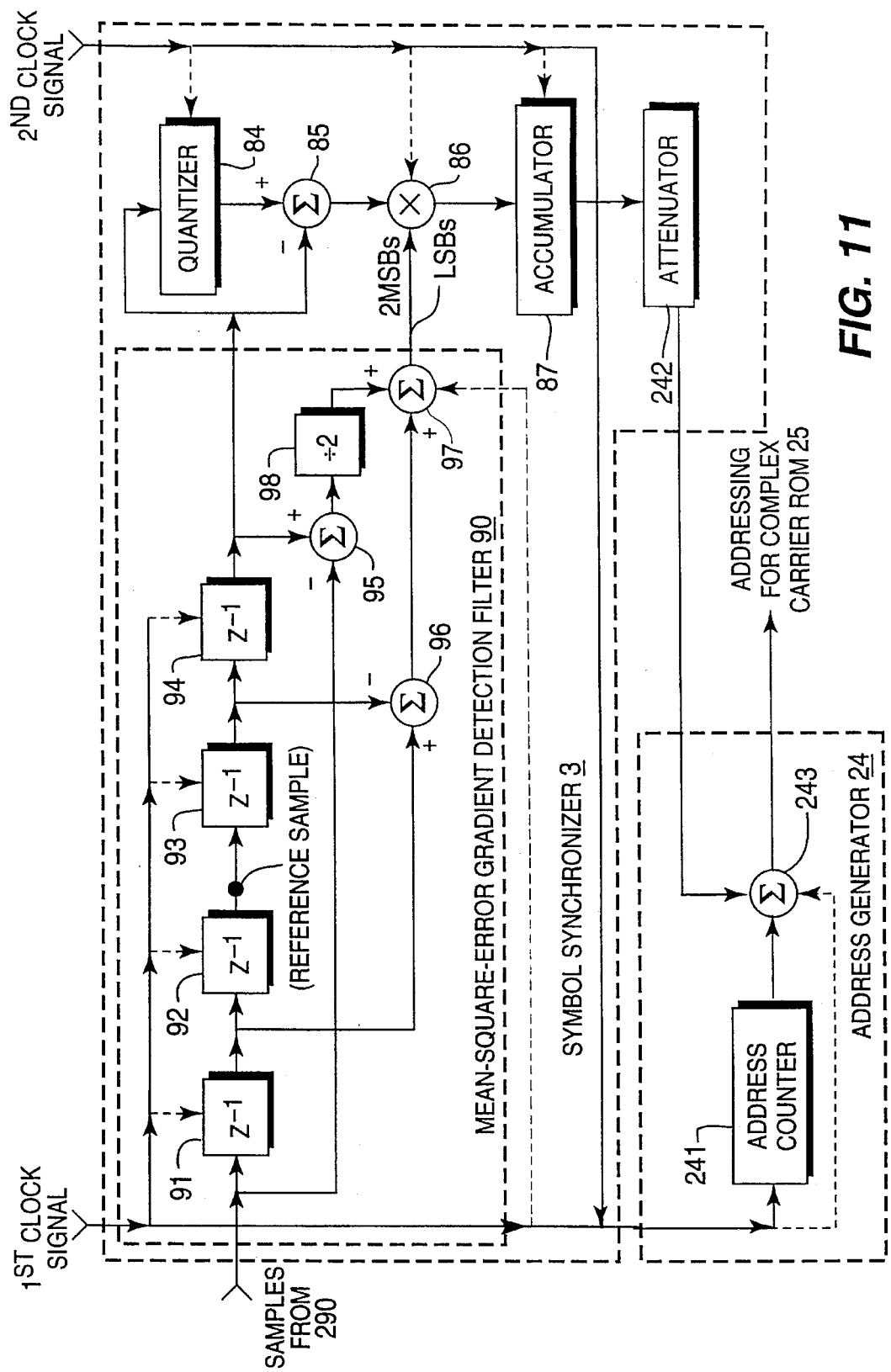
FIG. 11 is a block schematic diagram of a decision-directed symbol synchronizer, as included in a preferred embodiment of the FIG. 1 receiver.

FIG. 11 shows details of the address generator 24 and of the decision-directed symbol synchronizer 3 in a preferred embodiment of the FIG. 1 VSB signal receiver. In the address generator 24 the first clock signal is supplied to the address counter 241, and transitions in the first clock signal are counted by the address counter 241. By way of example, the address counter 241 is a 4-stage binary counter for dividing the 21.08 MHz sample clock frequency by sixteen so the ROM 25 will store descriptions of a 1.32 MHz carrier that is a one-eighth submultiple of symbol frequency. The resulting address count is provided with a several-bit-place extension of ZEROs in the direction of reduced significance, as a first summand input signal for the digital adder 243 that generates the addresses for the ROM 25. A second summand input signal for the digital adder 243 is provided by the output signal from an attenuator 242 that FIG. 11 shows as being included in the symbol synchronizer 3 for adjusting the amplitude of integrated phase error signal generated by the accumulator 87; the attenuator 242 is most simply provided by wired bit-place shift.

The symbol synchronizer 3 controls the relative phasing of the complex carrier wave read from the ROM circuitry 25 with respect to the sampling done by the ADC 22. A dynamic adjustment of this phasing is necessary because the VSB signal, as transmitted, has a carrier frequency that is not necessarily an exact multiple of symbol frequency. Therefore, transitions in symbol code can take place at random phasing respective to carrier frequency. If the HDTV signal transmission standards required that the VSB signal be transmitted with a carrier frequency that is an exact multiple of symbol frequency and that symbol transitions be made at prescribed phasings of the carrier frequency, there would be no need for a symbol synchronizer, the inventors point out. The construction of the symbol sychronizer 3 will be considered in more detail, immediately following.

The samples from the in-phase synchronous detector 29, or 290, are applied as input signal to a mean-square-error gradient detection filter 90. The filter 90 is a finite-impulse-response digital filter having a $(-\frac{1}{2})$, 1, 0, $(-1)$, $(+\frac{1}{2})$ kernel, the operation of which is clocked by the first sampling clock. The filter 90 includes a cascade connection of clocked latches 91, 92, 93 and 94 and further includes digital adder/subtractors 95, 96 and 97. The digital adder/subtractors 95 and 96 are operated unclocked, but the digital adder/subtractor 97 is operated as a clocked element by including a clocked latch at its output, which is clocked by the first sampling clock. Each of the clocked elements 91–94 and 97 exhibits unit clock delay at the 21 megasample/second clock rate of the first sampling clock that the ADC 22 uses for input sampling. The adder/subtractor 95 is operated as a subtractor, for subtracting the current input sample supplied to the filter 90 from the input sample supplied four sample periods before. The adder/subtractor 96 is operated as a subtractor, for subtracting, from the input sample supplied one sample period earlier than the current one, the input sample supplied three sample periods earlier. The adder/subtractor 97 is operated as an adder, adding to the difference signal from the subtractor 96 one-half the difference signal from the subtractor 95. The sum signal of the adder 97 is supplied as the filter 90 response.

The samples from the in-phase synchronous detector 290, as delayed by the cascade connection of the clocked latches 91, 92, 93 and 94, are supplied to a quantizer 84, which supplies the quantization level most closely approximated by the sample currently received by the quantizer 84 as input signal. This quantization level has the quantizer 84 input signal subtracted therefrom by a digital adder/subtractor 85, which is operated as a clocked element by including a clocked latch at its output. The filter 90 response is in temporal alignment with the difference signal from the subtractor 85. The difference signal from the subtractor 85 is indicative of the correction required to correct for error in the symbols as detected by the in-phase synchronous detector 290, but does not indicate whether the error arising from the sampling at the VSB signal receiver 5 being misphased is due to sampling too early or too late in time. A digital multiplier 86 multiplies the difference signal from the subtractor 85 by the filter 90 response to resolve this issue. The sign bit and the next most significant bit of the two's complement sum signal from the adder 97 suffice for the multiplication, which permits simplification of the digital multiplier 86 structure. The samples of the product signal from the digital multiplier 86 are indications of symbol timing error supplied to an accumulator 87 for integration. That is, the accumulator 87 provides means for integrating the indications of symbol timing error over a prescribed time interval to generate an integrated symbol timing error signal. The integrated symbol timing error signal from accumulator 87 is supplied to the attenuator 242. The attenuator 242 generates a symbol phase correction supplied as second summand signal to the digital adder 243 that generates the addresses for the ROM 25 as its sum output signal. That is, the attenuator 242 provides means responsive to the integrated symbol timing error signal from the accumulator 87 for applying the symbol phase correction to the adder 243, which provides means combining a symbol phase correction with said address count for generating read-only memory addressing.

Figure 12:
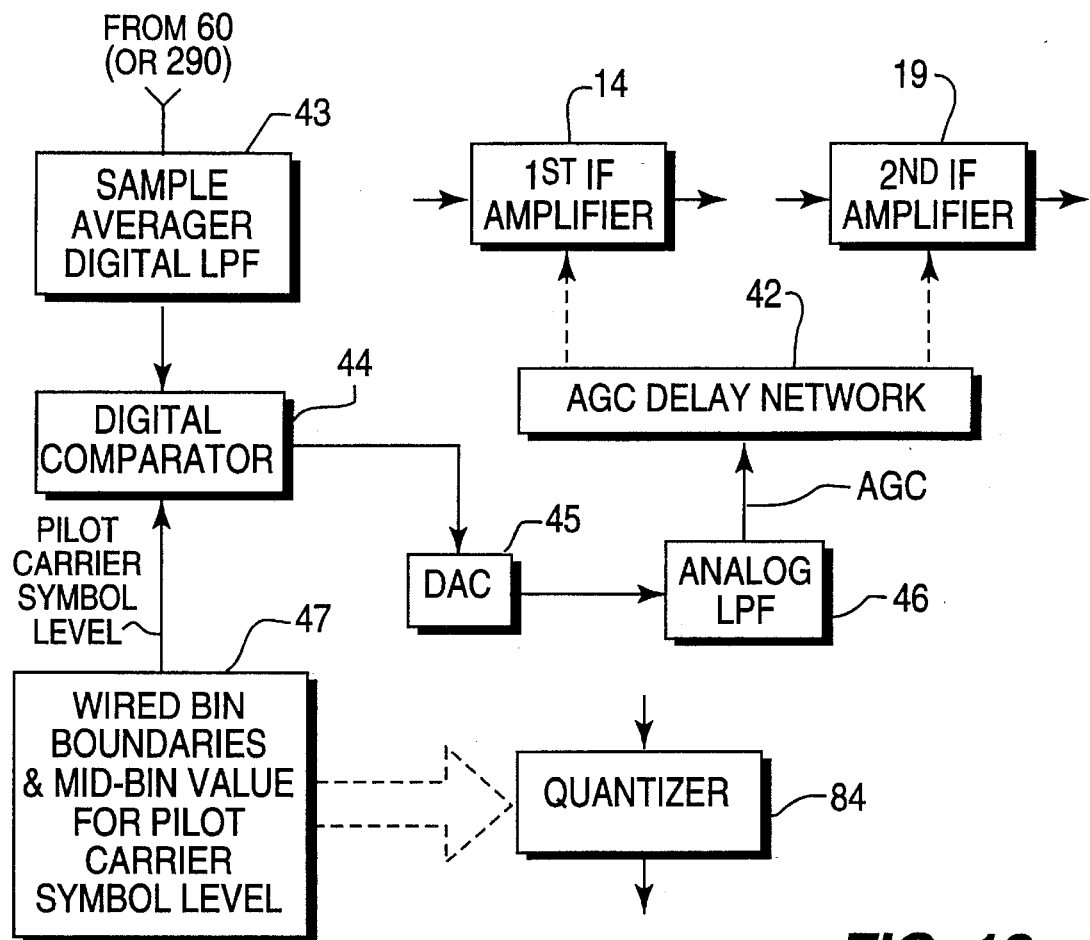
FIG. 12 is a block schematic diagram illustrating an aspect of the invention in which narrowband in-phase synchronous detection of the pilot carrier component of the VSB signal is used for automatic gain control of the intermediate-frequency amplifiers so the symbol levels used in the symbol codes described by the VSB signal are located in the middle of amplitude range bins for a quantizer in the symbol synchronizer.

FIG. 12 shows an arrangement for supplying automatic gain control (AGC) signal to an AGC delay network 42 that supplies gain-control signals to the first IF amplifier 14 and the second IF amplifier 19 of the FIG. 1 VSB signal receiver 5 for controlling their respective gains. The combined operation of the first IF amplifier 14, the second IF amplifier 19 and the AGC delay network 42 is accordance with prior-art practice. What is of particular interest is the way in which the AGC input signal is generated for application to the AGC delay network 42. The output signal from the narrowband in-phase synchronous detector 60 is supplied to a digital lowpass filter 43, which is basically of the type that averages samples over time to recover a digital signal indicative of the level of the received pilot carrier. The digital signal indicative of the level of the received pilot carrier is supplied to a plural-bit digital comparator 44, or digital subtractor, for comparison to a prescribed pilot carrier level. This prescribed pilot carrier level is referred to the mid-bin value of the amplitude range bin for the symbol level corresponding to-prescribed pilot carrier level in the quantizer 84, which is presumed to be of the so-called "hard-decision" type in which amplitude levels that define amplitude range bin boundaries are fixed and do not change over time responsive to signal statistics. The hard-decision type of quantizer 84 comprises a number of digital comparators for comparing its input signal to wired values of respective inter-bin boundaries supplied by connection circuitry 47 and decision circuitry responsive to the digital comparator responses for deciding the identity of the symbol in terms of the data encoded by the symbol. The decision circuitry is implemented in logic circuitry; or, alternatively, read-only memory addressed by the digital comparator responses regenerates the data encoded by the symbol. The connection circuitry 47 also supplies the digital comparator 44 the wired value that specifies the prescribed pilot carrier level. The digital output signal of the digital comparator 44, which indicates the amount of excess IF-signal gain provided by the first IF amplifier 14 and the second IF amplifier 19 of the FIG. 1 VSB signal receiver 5, is converted to an analog signal by a digital-to-analog converter (DAC) 45; and the analog output signal of the DAC 45 is lowpass filtered by an analog lowpass filter 46 to generate the AGC input signal applied to the AGC delay network 42. The analog lowpass filter 46 is conventionally of resistor-capacitor construction. The AGC delay network 42 may include an AGC signal amplifier for the AGC input signal, but with carefully design the need for such AGC signal amplifier can be avoided. Arrangements of the type shown in FIG. 12 permit AGC of the VSB signal receiver IF amplifiers to regulate the fullband in-phase synchronous detector response so that changes in its signal levels are likely to be between mid-bin values for a hard-decision type of quantizer used in the symbol synchronizer.

The narrowband in-phase synchronous detector 60 is not used in alternative embodiments of the invention in which the digital lowpass filter 43 receives as its input signal the response of the fullband in-phase synchronous detector 290. In these alternative embodiments of the invention solely the selectivity of the digital lowpass filter 43 is relied on for rejecting in-phase synchronous detection response to components of the received VSB signal other than its accompanying pilot carrier. The pilot carrier is continuously available and has substantial signal energy, which makes it a good signal from which to develop AGC signal. Furthermore, the digital HDTV transmission standards regulate the amplitude of the transmitted pilot carrier vis-à-vis symbol code levels, so that symbol code levels can be controlled by controlling pilot carrier gain.

Alternatively, the regulation of the amplitude of the transmitted pilot carrier vis-a-vis symbol code levels facilitates receiver circuitry that infers symbol code levels from pilot carrier gain level.

Figure 13:
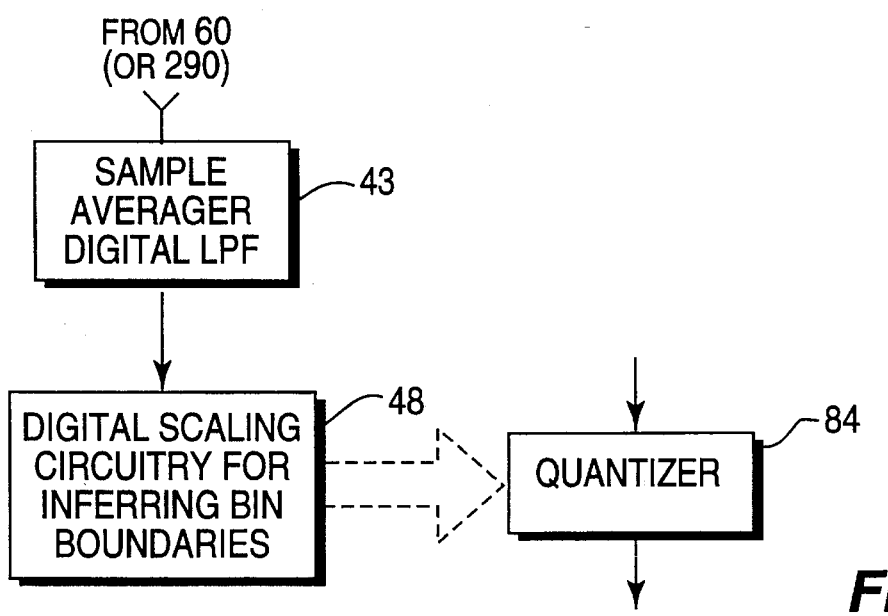
FIG. 13 is a block schematic diagram illustrating an aspect of the invention in which narrowband in-phase synchronous detection of the pilot carrier component of the VSB signal is used to regulate the boundaries of amplitude range bins for a quantizer in the symbol synchronizer, when automatic gain control of the intermediate-frequency amplifiers is not controlled by the result of narrowband in-phase synchronous detection.

FIG. 13 shows the narrowband in-phase synchronous detection of the pilot carrier component of the VSB signal being used to regulate the boundaries of amplitude range bins for a quantizer in the symbol synchronizer, when automatic gain control of the intermediate-frequency amplifiers is not controlled by the result of narrowband in-phase synchronous detection, so the quantizer 84 must be of a so-called "soft-decision" type in which amplitude levels that define amplitude range bin boundaries are changed over time responsive to the nature of the received signal. Digital scaling circuitry 48, which comprises a number of fixed-multiplicand digital multipliers, multiplies the multiplicands by the pilot carrier level described by the response of digital lowpass filter 43, for generating products that define boundary values for the amplitude range bins in the quantizer 84. These boundary values are applied to digital comparators in the quantizer 84 for having the quantizer 84 input signal compared against these values. The continuous availability of the pilot carrier, which has substantial signal energy, facilitates rapid tracking of the decision levels in the quantizer 84 with changes in VSB signal strength.

Figure 14:
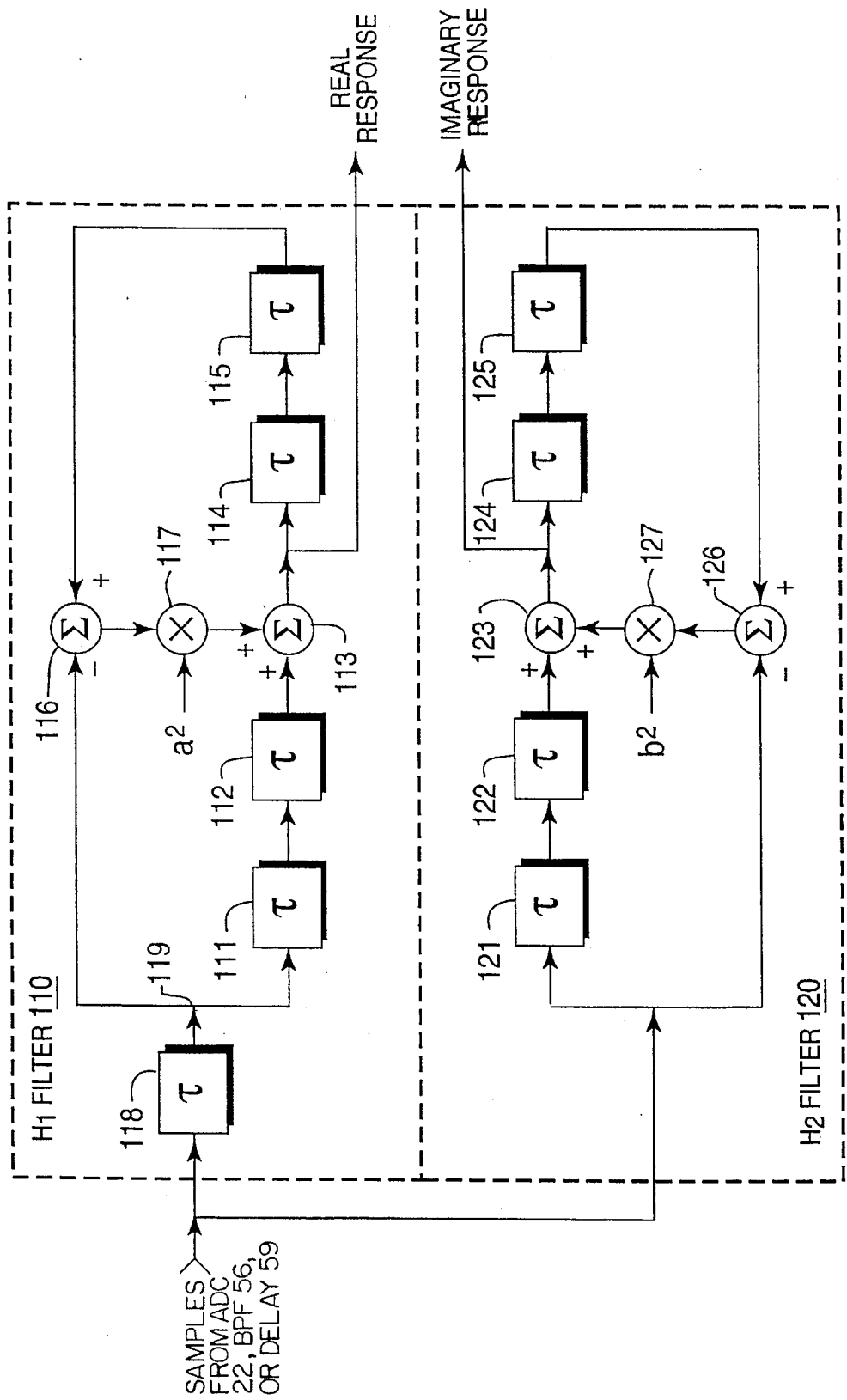
FIG. 14 is a detailed block schematic diagram of a pair of all-pass digital filters designed based on Jacobian elliptic functions and exhibiting a constant $\pi/2$ difference in phase response for the digitized bandpass signals, as can be employed in the synchronous detection circuitry of FIG. 6, 7, 8 or 9.

FIG. 14 is a detailed block schematic diagram of a complex-signal filter. The FIG. 16 filter includes a pair of all-pass digital filters 110 and 120 designed based on Jacobian elliptic functions and exhibiting a constant π/2 difference in phase response for the digitized bandpass signals, as described by C. M. Rader. The filters 150 and 151 of FIG. 6, 7, 8 or 9 can be constructed like filters 110 and 120. So can the filters 157 and 158 of FIG. 7. Since oversampled real samples better provide for the proper functioning of the mean-square-error gradient detection filter 90 in the symbol synchronizer 3, in their digital circuitry for synchrodyning VSB signals, the inventors prefer not to use other all-pass filters that Rader describes which exploit sub-sampling to provide further reductions in the delay network circuitry.

Figure 16:
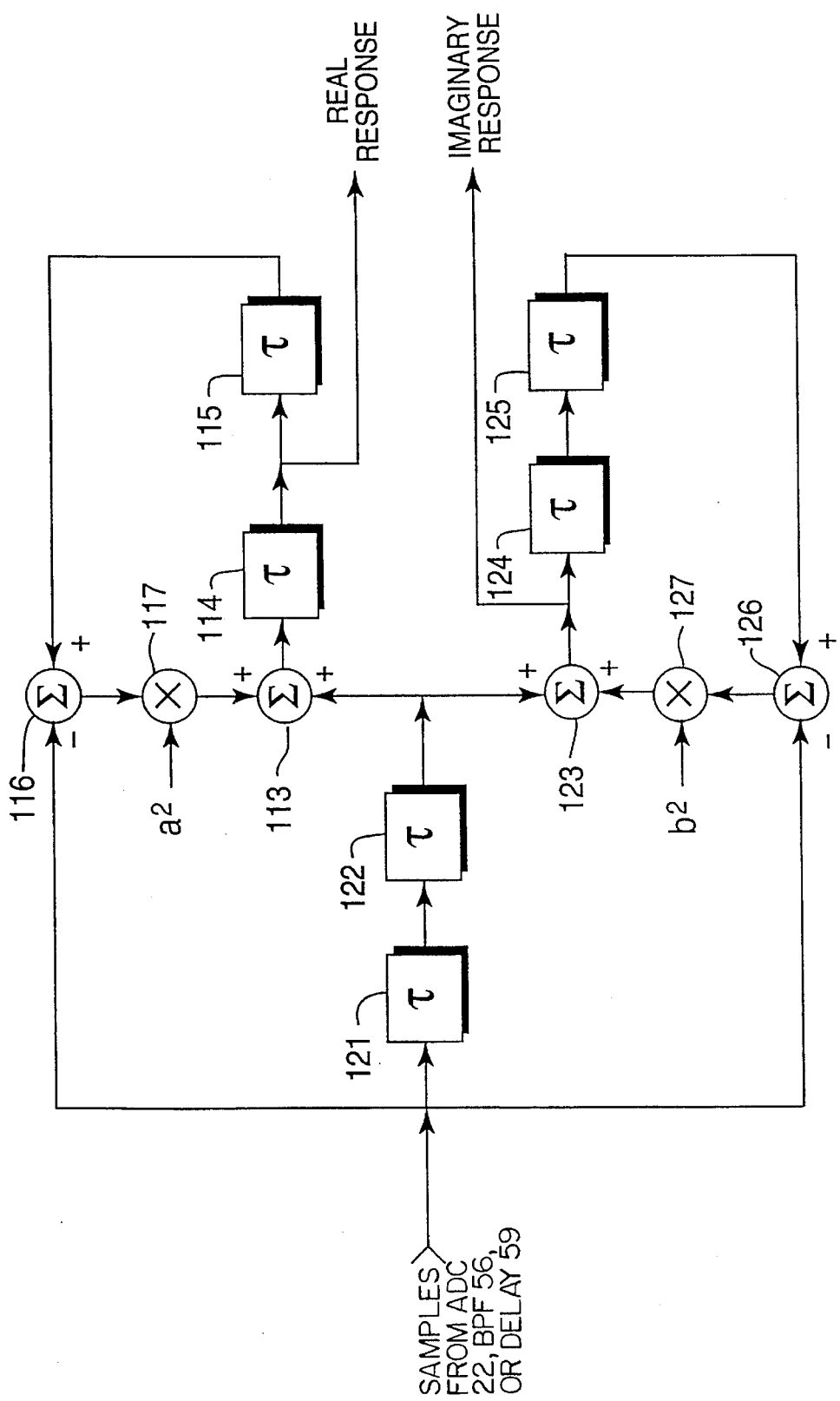

The construction of the filter 110, which provides the system function $H_1(z)=z^{-1}(z^{-2}-a^2)/(1-a^2z^{-2})$, where $a^2$=0.5846832 in decimal arithmetic, is shown in FIG. 16 to be as follows. The samples from the ADC 22 are delayed by one ADC sample clock duration in a clocked delay element 118 for application to a node 119. The signal at node 119 is further delayed by two ADC sample clock durations in cascaded clocked delay elements 111 and 112, for application as its first summand signal to a digital adder 113. The sum output signal of the adder 113 provides the real response from the filter 110: The sum output signal of the adder 113 is delayed by two ADC sample clock durations in cascaded clocked delay elements 114 and 115, for application as minuend input signal to a digital subtractor 116 that receives the signal at node 119 as its subtrahend input signal. The resulting difference output signal from the digital subtractor 116 is supplied as multiplier input signal to a digital multiplier 117 for multiplying an $a^2$ multiplicand signal, using a binary arithmetic. The resulting product output signal is applied to the digital adder 113 as its second summand signal.

The construction of the filter 120, which provides the system function $H_2(z)=-(z^{-2}b^2)/(1-b^2\ z^{-2})$, where $b^2=0.1380250$ in decimal arithmetic, is shown in FIG. 14 to be as follows. The samples from the ADC 22 are delayed by two ADC sample clock durations in cascaded clocked delay elements 121 and 122, for application as its first summand signal to a digital adder 123. The sum output signal;. of the adder 123 provides the imaginary response from the filter 120. The sum output signal of the adder 123 is delayed by two ADC sample clock durations in cascaded clocked delay elements 124 and 125, for application to a digital adder 126 as its second summand signal that receives the samples from the ADC 22 as its subtrahend input signal. The resulting sum output signal from the digital adder 126 is supplied as multiplier input signal to a digital multiplier 127 for multiplying a $b^2$ multiplicand signal, using a binary arithmetic. The resulting product output signal is applied to the digital adder 123 as its second summand signal.

Figure 15:
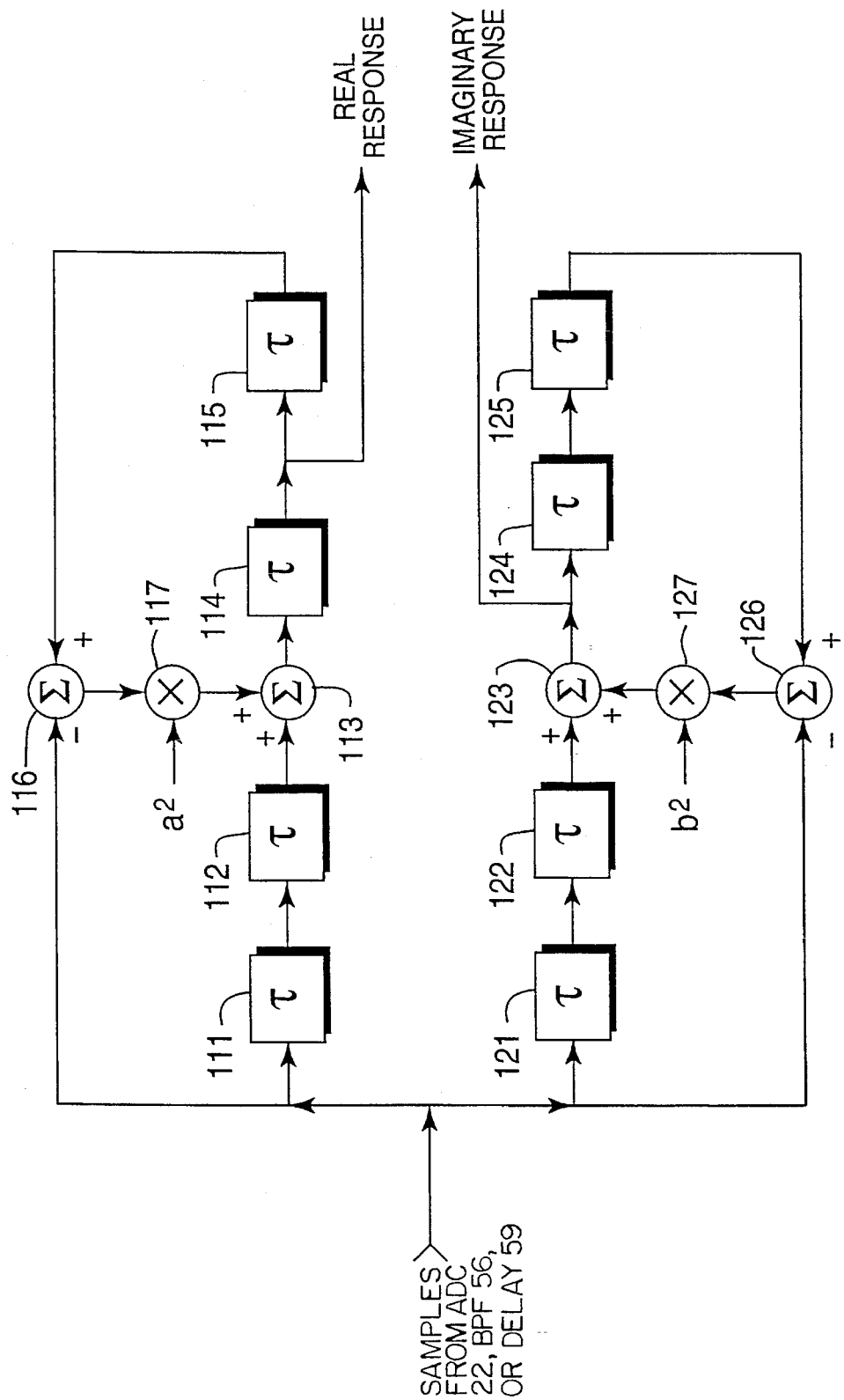
FIGS. 15 and 16 are block schematic diagrams of changes that can be made the filter circuitry of FIG. 14 to remove redundant delay.

FIG. 15 shows a complex-signal filter resulting from modifying the FIG. 14 complex-signal filter as follows. The position of the clocked delay element 118 is shifted so as to delay the sum output signal of the adder 113, rather than to delay the digital output signal of the ADC 22, and the digital output signal of the ADC 22 is applied to the node 119 without delay, thereby to cause real response to be provided at the output port of the shifted-in-position clocked delay element 118. The real response provided at the output port of the shifted-in-position clocked delay element 111 is the same as the response provided at the output port of the clocked delay element 114. So, the real response is provided from the output port of the clocked delay element 114 instead of from the output port of the shifted-in-position clocked delay element 111; and the shifted-in-position clocked delay element 111, being no longer required, is dispensed with.

FIG. 16 shows a complex-signal filter resulting from modifying the FIG. 14 complex-signal filter as follows. The first summand signal for the adder 113 is then taken from the cascaded clocked delay elements 121 and 122, rather than from the cascaded clocked delay elements 111 and 112. The cascaded clocked delay elements 111 and 112, being no longer required, are dispensed with. The FIG. 16 complex-signal filter is preferred over the complex-signal filters of FIGS. 14 and 15, in that redundant clocked delay elements are eliminated.

Filter pairs exhibiting a constant π/2 difference in phase response for the digitized bandpass signals, other than those described above, are possible and can be used to implement other embodiments of the invention.

One skilled in the art of digital filter design will understand that the digital delay line 51 in FIGS. 2, 3, 4 and 5 may be included as part of the FIR digital filter 50 structure, rather than being entirely separate therefrom. Similarly, in FIG. 2 the digital delay lines 54 and 55 may be included as parts of the carrier bandpass filters 52 and 53, respectively. In the claims which follow this specification and recite a digital delay line, dual usage of the delay line in a recited digital filter is to be considered as being within the scope of the claim.

In the claims which follow, the word "said" is used whenever reference is made to an antecedent, and the word "the" is used for other grammatical purposes, rather than to refer back to an antecedent.

What is claimed is:

1. A radio receiver for receiving vestigial sideband (VSB) signals including symbol codes descriptive of digital signals and including a pilot carrier having an amplitude related to signal levels in said symbol codes, said symbol codes changing at a symbol frequency, said radio receiver comprising:

a tuner, including means for selecting one of channels at different locations in a frequency band used for transmitting VSB signals, including a succession of mixers for performing respective conversions in the frequency of signal received in the selected channel, thus to generate a final intermediate-frequency (IF) signal disposed within a final intermediate-frequency band, including a respective frequency-selective amplifier stage between each earlier one of said mixers in said succession and each next one of said mixers in said succession, and including a respective local oscillator for supplying oscillations to each of said mixers, the oscillations from one of said local oscillators being controlled in frequency and in phase responsive to a first automatic frequency and phase control signal;

a sample clock generator for generating a sample clock signal comprising recurrent pulses, said recurrent pulses being generated at a sample rate controlled responsive to a second automatic frequency and phase control signal;

an address counter for counting said recurrent pulses to generate an address count;

means combining a symbol phase correction with said address count for generating read-only memory addressing;

read-only memory addressed by said read-only memory addressing for generating digital descriptions of in-phase and quadrature-phase carriers of a submultiple frequency that is a submultiple of said sample rate;

an analog-to-digital converter responsive to said sample clock signal for recurrently sampling a lowpass response to the signal from the final one of said mixers in said succession thereof included in said tuner, and for digitizing the resulting samples to generate a digitized final intermediate frequency signal;

means synchronously detecting, in accordance with the digital descriptions of said quadrature-phase carrier of said submultiple frequency, a pilot carrier component of said digitized final intermediate frequency signal for generating a digital quadrature synchronous detection result;

means for generating said first automatic frequency and phase control signal as a narrowband lowpass filter response to said digital quadrature synchronous detection result, thereby locking the carrier of said final intermediate frequency signal and said submultiple of said sample rate together in frequency and phase;

means synchronously detecting, in accordance with the digital descriptions of said in-phase carrier of said submultiple frequency, said digitized final intermediate frequency signal for generating a fullband digital in-phase synchronous detection result; and means, responsive to components of said fullband digital in-phase synchronous detection result that are equal to and substantially equal to said symbol frequency, for controlling the rate of the recurrent pulses of said sample clock signal supplied by said sample clock generator.

2. A radio receiver as set forth in claim 1, further comprising:

a symbol synchronizer responsive to said digital in-phase synchronous detection result for generating said symbol phase correction, which said symbol synchronizer comprises:

a first digital filter, clocked at said sample rate, for supplying a mean-square-error gradient detection response to said digital in-phase synchronous detection result;

a quantizer responding to said digital in-phase synchronous detection result to generate the closest one of the signal levels in said symbol codes as a quantizer output signal;

a digital subtractor for supplying a difference signal indicative of the departure of each sample of said quantizer output signal from the sample of said digital in-phase synchronous detection result generating said sample of quantizer output signal;

means for generating a product signal by multiplying samples of said difference signal by corresponding samples of said mean-square-error gradient detection response for generating indications of symbol timing error;

means for integrating said indications of symbol timing error over prescribed time interval to generate an integrated symbol timing error signal; and means responsive to said integrated symbol timing error signal for applying said symbol phase correction to said means combining said symbol phase correction with said address count for generating read-only memory addressing.

3. A radio receiver as set forth in claim 2, further comprising:

means synchronously detecting, in accordance with the digital descriptions of said in-phase carrier of said submultiple frequency, just said pilot carrier component of said digitized final intermediate frequency signal for generating a DC digital in-phase synchronous detection result; and means for controlling the operation of said quantizer in response to said DC digital in-phase synchronous detection result.

4. A radio receiver as set forth in claim 3, wherein said means for generating said DC digital in-phase synchronous detection result comprises, in addition to said means for generating said fullband digital in-phase synchronous detection result, a lowpass second digital filter for selecting said DC digital in-phase synchronous detection result from said fullband digital in-phase synchronous detection result.

5. A radio receiver as set forth in claim 3, wherein said means for generating said DC digital in-phase synchronous detection result is separate from said means for generating said fullband digital in-phase synchronous detection result.

6. A radio receiver as set forth in claim 3, wherein each said frequency-selective amplifier stage provides gain in an amount controlled by a respective gain control signal;

means for applying each said respective gain control signal in a respective amount controlled by an automatic gain control input signal; and means for supplying said DC digital in-phase synchronous detection result, at least under selected conditions, to said means for applying each said respective gain control signal as said automatic gain control input signal.

7. A radio receiver as set forth in claim 6, wherein there is more than one said frequency-selective amplifier stage, and wherein said means for applying each said respective gain control signal includes an AGC delay network responsive to said automatic gain control input signal for applying said respective gain control signals.

8. A radio receiver as set forth in claim 7 wherein said means for supplying said DC digital in-phase synchronous detection result, at least under selected conditions, to said means for applying each said respective gain control signal as said automatic gain control input signal is of a type that supplies said DC digital in-phase synchronous detection result under any and all conditions to said AGC delay network as said automatic gain control input signal.

9. A radio receiver as set forth in claim 7 wherein said means for supplying said DC digital in-phase synchronous detection result, at least under selected conditions, to said means for applying each said respective gain control signal as said automatic gain control input signal comprises:

an analog-OR circuit receiving said DC digital in-phase synchronous detection result as one of plural input signals thereto and supplying said automatic gain control input signal to said means for applying each said respective gain control signal.

10. A radio receiver as set forth in claim 1, wherein responsive to said read-only memory addressing said read-only memory generates digital descriptions of a sine wave and a cosine wave of said submultiple frequency, and wherein said means for generating said digital quadrature synchronous detection result comprises:

a finite-impulse-response, first digital filter generating a Hilbert transform response to said digitized final intermediate-frequency signal, as delayed by the latency time of said first digital filter;

a first digital delay line for delaying the digitized final intermediate-frequency signal by a delay equal to the latency time of said first digital filter, thereby to generate a delayed digitized final intermediate-frequency signal;

finite-impulse-response, narrow-bandpass, second and third digital filters having identical response functions centering on the carrier frequency of said digitized final intermediate-frequency signal, said second digital filter in cascade connection after said first digital filter for providing a frequency-selective response to the Hilbert transform of said digitized final intermediate-frequency signal as delayed by the latency time of said first digital filter and as further delayed by the latency time of said second digital filter, said third digital filter in cascade connection after said first digital delay line for providing a frequency-selective response to said delayed digitized final intermediate-frequency signal as further delayed by the latency time of said third digital filter;

a first digital multiplier, receptive of the frequency-selective response of said second digital filter as its multiplicand signal and receptive of the digitized samples of said cosine wave of said submultiple frequency as its multiplier signal, for generating a first product signal;

a second digital multiplier, receptive of the frequency-selective response of said third digital filter as its multiplicand signal and receptive of the digitized samples of said sine wave of said submultiple frequency as its multiplier signal, for generating a second product signal; and a first digital subtractor differentially combining said first and second product signals for generating a first difference signal supplied as said digital quadrature synchronous detection result.

11. A radio receiver as set forth in claim 10 wherein said means for generating said fullband digital in-phase synchronous detection result comprises:

a second digital delay line for further delaying the delayed digitized final intermediate-frequency signal from said first digital delay line by an additional delay equal to the latency time of said second digital filter, thereby to generate a further-delayed digitized final intermediate-frequency signal;

a third digital delay line for delaying the delayed Hilbert transform response of said first digital filter by an additional delay equal to the latency time of said third digital filter, thereby to generate a further-delayed Hilbert transform of the digitized final intermediate-frequency signal;

a third digital multiplier, receptive of said further-delayed digitized final intermediate-frequency signal as its multiplicand signal and receptive of the digitized samples of said cosine wave of said submultiple frequency as its multiplier signal, for generating a third product signal;

a fourth digital multiplier, receptive of said further delayed Hilbert transform of the digitized final intermediate-frequency signal as its multiplicand signal and receptive of the digitized samples of said sine wave of said submultiple frequency as its multiplier signal, for generating a fourth product signal; and a first digital adder additively combining said third and fourth product signals for generating a first sum signal supplied as said fullband digital in-phase synchronous detection result.

12. A radio receiver as set forth in claim 11, further comprising a symbol synchronizer responsive to said fullband digital in-phase synchronous detection result for generating said symbol phase correction, which said symbol synchronizer comprises:

a fourth digital filter, clocked at said sample rate, for supplying a mean-square-error gradient detection response to said digital in-phase synchronous detection result;

a quantizer responding to said digital in-phase detection result to generate the closest one of the signal levels in said symbol codes as a quantizer output signal;

a second digital subtractor for supplying a second difference signal indicative of the departure of each sample of said quantizer output signal from the sample of said digital in-phase synchronous detection result generating said sample of quantizer output signal;

means for generating a product signal by multiplying samples of said second difference signal by corresponding samples of said mean-square-error gradient detection response for generating indications of symbol timing error;

means for integrating said indications of symbol timing error over prescribed time interval to generate an .integrated symbol timing error signal; and means responsive to said integrated symbol timing error signal for applying said symbol phase correction to said means for generating read-only memory addressing.

13. A radio receiver as set forth in claim 12, further comprising:

means synchronously detecting, in accordance with the digital descriptions of said in-phase carrier of said submultiple frequency, just said pilot carrier component of said digitized final intermediate frequency signal for generating a DC digital in-phase synchronous detection result; and means for controlling the operation of said quantizer in response to said DC digital in-phase synchronous detection result.

14. A radio receiver as set forth in claim 13, wherein said means for generating said DC digital in-phase synchronous detection result comprises, in addition to said means for generating said fullband digital in-phase synchronous detection result, a lowpass fifth digital filter for selecting said DC digital in-phase synchronous detection result from said fullband digital in-phase synchronous detection result.

15. A radio receiver as set forth in claim 13, wherein said means for generating said DC digital in-phase synchronous detection result comprises, in addition to said first digital delay line, said first digital filter, said second digital filter and said third digital filter, the following:

a fifth digital multiplier, receptive of the frequency-selective response of said second digital filter as its multiplicand signal and receptive of the digitized samples of said sine wave of said submultiple frequency as its multiplier signal, for generating a fifth product signal;

a sixth digital multiplier, receptive of the frequency-selective response of said third digital filter as its multiplicand signal and receptive of the digitized samples of said cosine wave of said submultiple frequency as its multiplier signal, for generating a sixth product signal;

a second digital adder additively combining said fifth and sixth product signals for generating a second sum signal; and a digital lowpass filter for supplying said DC digital in-phase synchronous detection result in response to said second sum signal.

16. A radio receiver as set forth in claim 1, wherein responsive to said read-only memory addressing said read-only memory generates digital descriptions of a sine wave and a cosine wave of said submultiple frequency, and wherein said means for generating said digital quadrature synchronous detection result comprises:

a finite-impulse-response, narrow-bandpass, first digital filter receiving said digitized final intermediate-frequency signal from said analog-to-digital converter and providing after a latency time for said first digital filter a frequency-selective response to portions of said digitized final intermediate-frequency signal centering on its carrier frequency;

a finite-impulse-response, second digital filter, responding to the frequency-selective response of said first digital filter to generate a response of said second digital filter which is the Hilbert transform of the frequency-selective response of said first digital filter, as delayed by the latency time of said second digital filter;

a first digital delay line for delaying the frequency-selective response of said first digital filter by a delay equal to the latency time of said second digital filter, thereby to generate a first digital delay line response;

a first digital multiplier, receptive of the response of said second digital filter as its multiplicand signal and receptive of the digitized samples of said cosine wave of said submultiple frequency as its multiplier signal, for generating a first product signal;

a second digital multiplier, receptive of the response of said first digital delay line as its multiplicand signal and receptive of the digitized samples of said sine wave of said submultiple frequency as its multiplier signal, for generating a second product signal; and a first digital subtractor differentially combining said first and second product signals for generating a first difference signal supplied as said digital quadrature synchronous detection result.

17. A radio receiver as set forth in claim 16 wherein said means for generating said fullband digital in-phase synchronous detection result comprises:

a second digital delay line for delaying the digitized final intermediate-frequency signal by a delay equal to the latency time of said first digital filter, thereby to generate a delayed digitized final intermediate-frequency signal;

a finite-impulse-response, third digital filter, responding to said delayed digitized final intermediate-frequency signal to generate a response of said third digital filter which is the Hilbert transform of said delayed digitized final intermediate-frequency signal, as further delayed by the latency time of said third digital filter;

a third digital delay line for further delaying the delayed digitized final intermediate-frequency signal from said second digital delay line by an additional delay equal to the latency times of said third digital filter, thereby to generate a further-delayed digitized final intermediate-frequency signal;

a third digital multiplier, receptive of said further-delayed digitized final intermediate-frequency signal from said third digital delay line as its multiplicand signal and receptive of the digitized samples of said cosine wave of said submultiple frequency as its multiplier signal, for generating a third product signal;

a fourth digital multiplier, receptive of the response of said third digital filter as its multiplicand signal and receptive of the digitized samples of said sine wave of-said submultiple frequency as its multiplier signal, for generating a fourth product signal; and a first digital adder additively combining said third and fourth product signals for generating a first sum signal supplied as said fullband digital in-phase synchronous detection result.

18. A radio receiver as set forth in claim 16, further comprising a symbol synchronizer responsive to said fullband digital in-phase synchronous detection result for generating said symbol phase correction, said symbol synchronizer comprises:

a third digital filter, clocked at said sample rate, for supplying a mean-square-error gradient detection response to said digital in-phase synchronous detection result;

a quantizer responding to said digital in-phase detection result to generate the closest one of the signal levels in said symbol codes as a quantizer output signal;

a second digital subtractor for supplying a second difference signal indicative of the departure of each sample of said quantizer output signal from the sample of said digital in-phase detection result generating said sample of quantizer output signal;

means for generating a product signal by multiplying samples of said second difference signal by corresponding samples of said mean-square-error gradient detection response for generating indications of symbol timing error;

means for integrating said indications of symbol timing error over prescribed time interval to generate an integrated symbol timing error signal; and means responsive to said integrated symbol timing error signal for applying said symbol phase correction to said means for generating read-only memory addressing.

19. A radio receiver as set forth in claim 18, further comprising:

means synchronously detecting, in accordance with the digital descriptions of said in-phase carrier of said submultiple frequency, just said pilot carrier component of said digitized final intermediate frequency signal for generating a DC digital in-phase synchronous detection result; and means for controlling the operation of said quantizer in response to said DC digital in-phase synchronous detection result.

20. A radio receiver as set forth in claim 19, wherein said means for generating said DC digital in-phase synchronous detection result comprises, in addition to said means for generating said fullband digital in-phase synchronous detection result, a lowpass fifth digital filter for selecting said DC digital in-phase synchronous detection result from said fullband digital in-phase synchronous detection result.

21. A radio receiver as set forth in claim 19, wherein said means for generating said DC digital in-phase synchronous detection result comprises, in addition to said first digital filter, said second digital filter and said first digital delay line, the following:

a fifth digital multiplier, receptive of the response of said second digital filter as its multiplicand signal and receptive of the digitized samples of said sine wave of said submultiple frequency as its multiplier signal, for generating a fifth product signal;

a sixth digital multiplier, receptive of the response of said first digital delay line as its multiplicand signal and receptive of the digitized samples of said cosine wave of said submultiple frequency as its multiplier signal, for generating a sixth product signal;

a second digital adder additively combining said fifth and sixth product signals for generating a second sum signal; and a digital lowpass filter for supplying said DC digital in-phase synchronous detection result in response to said second sum signal.

22. A radio receiver as set forth in claim 1, wherein said read-only memory generates digitized samples of a sine wave of said submultiple frequency and digitized samples of a cosine wave of said submultiple frequency as components of said digital descriptions of in-phase and quadrature-phase carriers of said submultiple frequency in complex form, wherein said means for generating said digital quadrature synchronous detection result comprises:

a finite-impulse-response, first digital filter generating a Hilbert transform response to said digitized final intermediate-frequency signal, as delayed by the latency time of said digital filter;

a digital delay line for delaying the digitized final intermediate-frequency signal by a delay equal to the latency time of said digital filter, thereby to generate a delayed digitized final intermediate-frequency signal;

a first digital multiplier, receptive of the Hilbert transform response of said digital filter as its multiplicand signal and receptive of the digitized samples of said cosine wave of said submultiple frequency as its multiplier signal, for generating a first product signal;

a second digital multiplier, receptive of said delayed digitized final intermediate-frequency signal from said digital delay line as its multiplicand signal and receptive of the digitized samples of said sine wave of said submultiple frequency as its multiplier signal, for generating a second product signal; and a first digital subtractor differentially combining said first and second product signals for generating a first difference signal, supplied as said digital quadrature synchronous detection result.

23. A radio receiver as set forth in claim 22 wherein said means for generating said fullband digital in-phase synchronous detection result comprises, in addition to said first digital filter and said digital delay line, the following:

a third digital multiplier, receptive of said delayed digitized final intermediate-frequency signal from said digital delay line as its multiplicand signal and receptive of the digitized samples of said cosine wave of said submultiple frequency as its multiplier signal, for generating a third product signal;

a fourth digital multiplier, receptive of the Hilbert transform response of said first digital filter as its multiplicand signal and receptive of the digitized samples of said sine wave of said submultiple frequency as its multiplier signal, for generating a fourth product signal; and a digital adder additively combining said third and fourth product signals for generating a sum signal supplied as said fullband digital in-phase synchronous detection result.

24. A radio receiver as set forth in claim 23, further comprising a symbol synchronizer responsive to said fullband digital in-phase synchronous detection result for generating said symbol phase correction, said symbol synchronizer comprises:

a second digital filter, clocked at said sample rate, for supplying a mean-square-error gradient detection response to said digital in-phase synchronous detection result;

a quantizer responding to said digital in-phase detection result to generate the closest one of the signal levels in said symbol codes as a quantizer output signal;

a second digital subtractor for supplying a second difference signal indicative of the departure of each sample of said quantizer output signal from the sample of said digital in-phase detection result generating said sample of quantizer output signal;

means for generating a product signal by multiplying samples of said second difference signal by corresponding samples of said mean-square-error gradient detection response for generating indications of symbol timing error;

means for integrating said indications of symbol timing error over prescribed time interval to generate an integrated symbol timing error signal; and means responsive to said integrated symbol timing error signal for applying said symbol phase correction to said means for generating read-only memory addressing.

25. A radio receiver as set forth in claim 24, further comprising:

a lowpass third digital filter for selecting a DC, digital in-phase synchronous detection result from said fullband digital in-phase synchronous detection result; and means for controlling the operation of said quantizer in response to said DC digital in-phase synchronous detection result.

26. A radio receiver as set forth in claim 1; wherein responsive to said read-only memory addressing said read-only memory generates digital descriptions of a sine wave and a cosine wave of said submultiple frequency, digital descriptions of a wave of said submultiple frequency advanced in phase from said sine wave of said submultiple frequency by a prescribed angle, and digital descriptions of a wave of said submultiple frequency advanced in phase from said cosine wave of said submultiple frequency by said prescribed angle; and wherein said means for generating said digital quadrature synchronous detection result comprises:

a finite-impulse-response, first digital filter generating a Hilbert transform response to said digitized final intermediate-frequency signal, as delayed by the latency time of said first digital filter;

a first digital delay line for delaying the digitized final intermediate-frequency signal by a delay equal to the latency time of said first digital filter, thereby to generate a delayed digitized final intermediate-frequency signal;

finite-impulse-response, narrow-bandpass, second and third digital filters having identical response functions centering on the carrier frequency of said digitized final intermediate-frequency signal, said second digital filter in cascade connection after said first digital filter for providing a frequency-selective response to the Hilbert transform of said digitized final intermediate-frequency signal as delayed by the latency time of said first digital filter and as further delayed by the latency time of said second digital filter, said third digital filter in cascade connection after said first digital delay line for providing a frequency-selective response to said delayed digitized final intermediate-frequency signal as further delayed by the latency time of said third digital filter;

a first digital multiplier, receptive of the frequency-selective response of said second digital filter as its multiplicand signal and receptive of the digitized samples of said cosine wave of said submultiple frequency by a prescribed angle as its multiplier signal, for generating a first product signal;

a second digital multiplier, receptive of the frequency-selective response of said third digital filter as its multiplicand signal and receptive of the digitized samples of said sine wave of said submultiple frequency as its multiplier signal by said prescribed angle, for generating a second product signal; and a first digital subtractor differentially combining said first and second product signals for generating a first difference signal supplied as said digital quadrature synchronous detection result.

27. A radio receiver as set forth in claim 26 wherein said means for generating said fullband digital in-phase synchronous detection result comprises, in addition to said first digital filter and said digital delay line, the following:

a third digital multiplier, receptive of said delayed digitized final intermediate-frequency signal from said digital delay line as its multiplicand signal and receptive of the digitized samples of said wave of said submultiple frequency advanced in phase from said cosine wave of said submultiple frequency as its multiplier signal, for generating a third product signal;

a fourth digital multiplier, receptive of the Hilbert transform response of said first digital filter as its multiplicand signal and receptive of the digitized samples of said wave of said submultiple frequency advanced in phase from said sine wave of said submultiple frequency as its multiplier signal, for generating a fourth product signal; and a first digital adder additively combining said third and fourth product signals for generating a first sum signal supplied as said fullband digital in-phase synchronous detection result.

28. A radio receiver as set forth in claim 27, further comprising a symbol synchronizer responsive to said fullband digital in-phase synchronous detection result for generating said symbol phase correction, which said symbol synchronizer comprises:

a fourth digital filter, clocked at said sample rate, for supplying a mean-square-error gradient detection response to said digital in-phase synchronous detection result;

a quantizer responding to said digital in-phase detection result to generate the closest one of the signal levels in said symbol codes as a quantizer output signal;

a second digital subtractor for supplying a second difference signal indicative of the departure of each sample of said quantizer output signal from the sample of said digital in-phase detection result generating said sample of quantizer output signal;

means for generating a product signal by multiplying samples of said second difference signal by corresponding samples of said mean-square-error gradient detection response for generating indications of symbol timing error;

means for integrating said indications of symbol timing error over prescribed time interval to generate an integrated symbol timing error signal; and means responsive to said integrated symbol timing error signal for applying said symbol phase correction to said means for generating read-only memory addressing.

29. A radio receiver as set forth in claim 28, further comprising:

means synchronously detecting, in accordance with the digital descriptions of said in-phase carrier of said submultiple frequency, just said pilot carrier component of said digitized final intermediate frequency signal for generating a DC digital in-phase synchronous detection result; and means for controlling the operation of said quantizer in response to said DC digital in-phase synchronous detection result.

30. A radio receiver as set forth in claim 29, wherein said means for generating said DC, digital in-phase synchronous detection result comprises, in addition to said means for generating said fullband digital in-phase synchronous detection result, a lowpass fifth digital filter for selecting said DC digital in-phase synchronous detection result from said fullband digital in-phase synchronous detection result.

31. A radio receiver as set forth in claim 29, wherein said means for generating said DC digital in-phase synchronous detection result detection result comprises, in addition to said first digital filter, said second digital filter and said first digital delay line, the following:

a fifth digital multiplier, receptive of the response of said second digital filter as its multiplicand signal and receptive of the digitized samples of sine wave of said submultiple frequency as its multiplier signal, for generating a fifth product signal;

a sixth digital multiplier, receptive of the response of said third digital filter as its multiplicand signal and receptive of the digitized samples of said cosine wave of said submultiple frequency as its multiplier signal, for generating a sixth product signal;

a second digital adder additively combining said fifth and sixth product signals for generating a second sum signal; and a digital lowpass filter for supplying said DC digital in-phase synchronous detection result in response to said second sum signal.

32. A radio receiver as set forth in claim 1, wherein responsive to said read-only memory addressing said read-only memory generates digital descriptions of a sine wave and a cosine wave of said submultiple frequency, and wherein said means for generating said digital quadrature synchronous detection result comprises:

first and second digital filters respectively generating first and second all-pass responses to frequencies throughout said final intermediate-frequency band, which first and second all-pass responses are substantially linear phase responses throughout said final intermediate-frequency band and exhibit substantially $\pi/2$ radians offset from each other at each frequency within said final intermediate-frequency band;

means for applying said digitized final intermediate-frequency signal to said first and second digital filters as a shared input signal to each of them;

finite-impulse-response, narrow-bandpass, third and fourth digital filters having identical response functions centering on the carrier frequency of said final intermediate-frequency signal, each of which said third and fourth digital filters exhibits a respective similar latency time, said third digital filter in cascade connection after said first digital filter for providing a frequency-selective response to the all-pass response of said first digital filter, said fourth digital filter in cascade connection after said second digital filter for providing a frequency-selective response to the all-pass response of said second digital filter;

a first digital multiplier, receptive of the frequency-selective response of said third digital filter as its multiplicand signal and receptive of the digitized samples of said cosine wave of said submultiple frequency as its multiplier signal, for generating a first product signal;

a second digital multiplier, receptive of the frequency-selective response of said fourth digital filter as its multiplicand signal and receptive of the digitized samples of said sine wave of said submultiple frequency as its multiplier signal, for generating a second product signal; and a first digital subtractor differentially combining said first and second product signals for generating a first difference signal supplied as said digital quadrature synchronous detection result.

33. A radio receiver as set forth in claim 32 wherein said means for generating said fullband digital in-phase synchronous detection result comprises, in addition to said first and second digital filters and to said means for applying said digitized final intermediate-frequency signal to said first and second digital filters as a shared input signal to each of them, the following:

a first digital delay line responding to the all-pass response of said first digital filter for supplying a first digital delay line response, reproducing the all-pass response of said first digital filter after a delay equal to the latency time of said third digital filter;

a second digital delay line responding to the all-pass response of said second digital filter for supplying a second digital delay line response, reproducing the all-pass response of said second digital filter after a delay equal to the latency time of said fourth digital filter;

a third digital multiplier, receptive of said first digital delay line response as its multiplicand signal, and receptive of the digitized samples of said cosine wave of said submultiple frequency as its multiplier signal, for generating a third product signal;

a fourth digital multiplier, receptive of said second digital delay line response as its multiplicand signal, and receptive of the digitized samples of said sine wave of said submultiple frequency as its multiplier signal, for generating a fourth product signal; and a first digital adder additively combining said third and fourth product signals for generating a first sum signal supplied as said fullband digital in-phase synchronous detection result.

34. A radio receiver as set forth in claim 33, further comprising a symbol synchronizer responsive to said fullband digital in-phase synchronous detection result for generating said symbol phase correction, which said symbol synchronizer comprises:

a fourth digital filter, clocked at said sample rate, for supplying a mean-square-error gradient detection response to said digital in-phase synchronous detection result;

a quantizer responding to said digital in-phase synchronous detection result to generate the closest one of the signal levels in said symbol codes as a quantizer output signal;

a second digital subtractor for supplying a second difference signal indicative of the departure of each sample of said quantizer output signal from the sample of said digital in-phase detection result generating said sample of quantizer output signal;

means for generating a product signal by multiplying samples of said second difference signal by corresponding samples of said mean-square-error gradient detection response for generating indications of symbol timing error;

means for integrating said indications of symbol timing error over prescribed time interval to generate an integrated symbol timing error signal; and means responsive to said integrated symbol timing error signal for applying said symbol phase correction to said means for generating read-only memory addressing.

35. A radio receiver as set forth in claim 34, further comprising:

means synchronously detecting, in accordance with the digital descriptions of said in-phase carrier of said submultiple frequency, just said pilot carrier component of said digitized final intermediate frequency signal for generating a DC digital in-phase synchronous detection result; and means for controlling the operation of said quantizer in response to said DC digital in-phase synchronous detection result.

36. A radio receiver as set forth in claim 35, wherein said means for generating said DC digital in-phase synchronous detection result comprises, in addition to said means for generating said fullband digital in-phase synchronous detection result, a lowpass fifth digital filter for selecting said DC digital in-phase synchronous detection result from said fullband digital in-phase synchronous detection result.

37. A radio receiver as set forth in claim 35, wherein said means for generating said DC digital in-phase synchronous detection result comprises, in addition to said first digital delay line, said first digital filter, said second digital filter and said third digital filter, the following:

a fifth digital multiplier, receptive of the frequency-selective response of said third digital filter as its multiplicand signal and receptive of the digitized samples of said sine wave of said submultiple frequency as its multiplier signal, for generating a fifth product signal;

a sixth digital multiplier, receptive of the frequency-selective response of said fourth digital filter as its multiplicand signal and receptive of the digitized samples of said cosine wave of said submultiple frequency as its multiplier signal, for generating a sixth product signal;

a second digital adder additively combining said fifth and sixth product signals for generating a second sum signal; and a digital lowpass filter for supplying said DC digital in-phase synchronous detection result in response to said second sum signal.

38. A radio receiver as set forth in claim 1, wherein responsive to said read-only memory addressing said read-only memory generates digital descriptions of a sine wave and a cosine wave of said submultiple frequency, and wherein said means for generating said digital quadrature synchronous detection result comprises:

a finite-impulse-response, narrow-bandpass, first digital filter receiving said digitized final intermediate-frequency signal from said analog-to-digital converter and providing after a latency time for said first digital filter a frequency-selective response to portions of said digitized final intermediate-frequency signal centering on its carrier frequency;

second and third digital filters respectively generating first and second all-pass responses to frequencies throughout said final intermediate-frequency band, which first and second all-pass responses are substantially linear phase responses throughout said final intermediate-frequency band and exhibit substantially $\pi/2$ radians offset from each other at each frequency within said final intermediate-frequency band;

means for applying the frequency-selective response of said first digital filter to said second and third digital filters as a shared input signal to each of them;

a first digital multiplier, receptive of the response of said second digital filter as its multiplicand signal and receptive of the digitized samples of said cosine wave of said submultiple frequency as its multiplier signal, for generating a first product signal;

a second digital multiplier, receptive of the response of said third digital filter as its multiplicand signal and receptive of the digitized samples of said sine wave of said submultiple frequency as its multiplier signal, for generating a second product signal; and a first digital subtractor differentially combining said first and second product signals for generating a first difference signal supplied as said digital quadrature synchronous detection result.

39. A radio receiver as set forth in claim 38, wherein said means for generating said fullband digital in-phase synchronous detection result comprises:

a digital delay line for delaying, by a delay equal to the latency time of said first digital filter, the digitized final intermediate-frequency signal generated by said analog-to-digital converter as said output signal therefrom, thereby to generate a delayed digitized final intermediate-frequency signal;

fourth and fifth digital filters respectively generating third and fourth all-pass responses to frequencies throughout said final intermediate-frequency band, which third and fourth all-pass responses are substantially linear phase responses throughout said final intermediate-frequency band and exhibit substantially $\pi/2$ radians offset from each other at each frequency within said final intermediate-frequency band;

means for applying said delayed digitized final intermediate-frequency signal to said fourth and fifth digital filters as a shared input signal to each of them;

a third digital multiplier, receptive of the response of said fourth digital filter as its multiplicand signal, and receptive of the digitized samples of said cosine wave of said submultiple frequency as its multiplier signal, for generating a third product signal;

a fourth digital multiplier, receptive of the response of said fifth digital filter as its multiplicand signal, and receptive of the digitized samples of said sine wave of said submultiple frequency as its multiplier signal, for generating a fourth product signal; and a first digital adder additively combining said third and fourth product signals for generating a first sum signal supplied as said fullband digital in-phase synchronous detection result.

40. A radio receiver as set forth in claim 39, further comprising a symbol synchronizer responsive to said fullband digital in-phase synchronous detection result for generating said symbol phase correction, which said symbol synchronizer comprises:

a sixth digital filter, clocked at said sample rate, for supplying a mean-square-error gradient detection response to said digital in-phase synchronous detection result;

a quantizer responding to said digital in-phase detection result to generate the closest one of the signal levels in said symbol codes as a quantizer output signal;

a second digital subtractor for supplying a second difference signal indicative of the departure of each sample of said quantizer output signal from the sample of said digital in-phase detection result generating said sample of quantizer output signal;

means for generating a product signal by multiplying samples of said second difference signal by corresponding samples of said mean-square-error gradient detection response for generating indications of symbol timing error;

means for integrating said indications of symbol timing error over prescribed time interval to generate an integrated symbol timing error signal; and means responsive to said integrated symbol timing error signal for applying said symbol phase correction to said means for generating read-only memory addressing.

41. A radio receiver as set forth in claim 40, further comprising:

means synchronously detecting, in accordance with the digital descriptions of said in-phase carrier of said submultiple frequency, just said pilot carrier component of said digitized final intermediate frequency signal for generating a DC digital in-phase synchronous detection result; and means for controlling the operation of said quantizer in response to said DC digital in-phase synchronous detection result.

42. A radio receiver as set forth in claim 41, wherein said means for generating said DC digital in-phase synchronous detection result comprises, in addition to said means for generating said fullband digital in-phase synchronous detection result, a lowpass fifth digital filter for selecting said DC digital in-phase synchronous detection result from said fullband digital in-phase synchronous detection result.

43. A radio receiver as set forth in claim 41, wherein said means for generating said DC digital in-phase synchronous detection result comprises, in addition to said first digital filter, said second digital filter and said third digital filter, the following:

a fifth digital multiplier, receptive of the response of said second digital filter as its multiplicand signal and receptive of the digitized samples of said sine wave of said submultiple frequency as its multiplier signal, for generating a fifth product signal;

a sixth digital multiplier, receptive of the response of said third digital filter as its multiplicand signal and receptive of the digitized samples of said cosine wave of said submultiple frequency as its multiplier signal, for generating a sixth product signal;

a second digital adder additively combining said fifth and sixth product signals for generating a second sum signal; and a digital lowpass filter for supplying said DC digital in-phase synchronous detection result in response to said second sum signal.

44. A radio receiver as set forth in claim 1, wherein responsive to said read-only memory addressing said read-only memory generates digital descriptions of a sine wave and a cosine wave of said submultiple frequency, and wherein said means for generating said digital quadrature synchronous detection result comprises:

first and second digital filters respectively generating first and second all-pass responses to frequencies throughout said final intermediate-frequency band, which first and second all-pass responses are substantially linear phase responses throughout said final intermediate-frequency band and exhibit substantially $\pi/2$ radians offset from each other at each frequency within said final intermediate-frequency band;

means for applying said digitized final intermediate-frequency signal to said first and second digital filters as a shared input signal to each of them;

a first digital multiplier, receptive of the frequency-selective response of said first digital filter as its multiplicand signal and receptive of the digitized samples of said cosine wave of said submultiple frequency as its multiplier signal, for generating a first product signal;

a second digital multiplier, receptive of the frequency-selective response of said second digital filter as its multiplicand signal and receptive of the digitized samples of said sine wave of said submultiple frequency as its multiplier signal, for generating a second product signal;

a first digital subtractor differentially combining said first and second product signals for generating a first difference signal; and a third digital filter generating a lowpass response to said first difference signal, said lowpass response being supplied as said digital quadrature synchronous detection result.

45. A radio receiver as set forth in claim 44, wherein said means for generating said fullband digital in-phase synchronous detection result comprises, in addition to said first digital filter, said second digital filter and said means for applying said digitized final intermediate-frequency signal to said first and second digital filters as a shared input signal to each of them, the following:

a third digital multiplier, receptive of the response of said first digital filter as its multiplicand signal and receptive of the digitized samples of said sine wave of said submultiple frequency as its multiplier signal, for generating a third product signal;

a fourth digital multiplier, receptive of the response of said second digital filter as its multiplicand signal and receptive of the digitized samples of said cosine wave of said submultiple frequency as its multiplier signal, for generating a fourth product signal; and a digital adder additively combining said third and fourth product signals for generating a sum signal supplied as said fullband digital in-phase synchronous detection result.

46. A radio receiver as set forth in claim 45, further comprising a symbol synchronizer responsive to said fullband digital in-phase synchronous detection result for generating said symbol phase correction, which said symbol synchronizer comprises:

a third digital filter, clocked at said sample rate, for supplying a mean-square-error gradient detection response to said digital in-phase synchronous detection result;

a quantizer responding to said digital in-phase detection result to generate the closest one of the signal levels in said symbol codes as a quantizer output signal;

a second digital subtractor for supplying a second difference signal indicative of the departure of each sample of said quantizer output signal from the sample of said digital in-phase detection result generating said sample of quantizer output signal;

means for generating a product signal by multiplying samples of said second difference signal by corresponding samples of said mean-square-error gradient detection response for generating indications of symbol timing error;

means for integrating said indications of symbol timing error over prescribed time interval to generate an integrated symbol timing error signal; and means responsive to said integrated symbol timing error signal for applying said symbol phase correction to said means for generating read-only memory addressing.

47. A radio receiver as set forth in claim 46, further comprising:

a lowpass fourth digital filter for selecting a DC digital in-phase synchronous detection result from said fullband digital in-phase synchronous detection result; and means for controlling the operation of said quantizer in response to said DC digital in-phase synchronous detection result.

48. A radio receiver as set forth in claim 1; wherein responsive to said read-only memory addressing said read-only memory generates digital descriptions of a sine wave and a cosine wave of said submultiple frequency, digital descriptions of a wave of said submultiple frequency advanced in phase from said sine wave of said submultiple frequency by a prescribed angle, and digital descriptions of a wave of said submultiple frequency advanced in phase from said cosine wave of said submultiple frequency by said prescribed angle; and wherein said means for generating said digital quadrature synchronous detection result comprises:

first and second digital filters respectively generating first and second all-pass responses to frequencies throughout said final intermediate-frequency band, which first and second all-pass responses are substantially linear phase responses throughout said final intermediate-frequency band and exhibit substantially $\pi/2$ radians offset from each other at each frequency within said final intermediate-frequency band;

means for applying said digitized final intermediate-frequency signal to said first and second digital filters as a shared input signal to each of them;

finite-impulse-response, narrow-bandpass, third and fourth digital filters having identical response functions centering on the digitized carrier frequency of said final intermediate-frequency signal, each of which said third and fourth digital filters exhibits a respective similar latency time, said third digital filter in cascade connection after said first digital filter for providing a frequency-selective response to the all-pass response of said first digital filter, said fourth digital filter in cascade connection after said second digital filter for providing a frequency-selective response to the all-pass response of said second digital filter;

a first digital multiplier, receptive of the frequency-selective response of said third digital filter as its multiplicand signal and receptive of the digitized samples of said cosine wave of said submultiple frequency as its multiplier signal, for generating a first product signal;

a second digital multiplier, receptive of the frequency-selective response of said fourth digital filter as its multiplicand signal and receptive of the digitized samples of said sine wave of said submultiple frequency as its multiplier signal, for generating a second product signal; and a first digital subtractor differentially combining said first and second product signals for generating a first difference signal supplied as said digital quadrature synchronous detection result.

49. A radio receiver as set forth in claim 48 wherein said means for generating said fullband digital in-phase synchronous detection result comprises, in addition to said first and second digital filters, the following:

a third digital multiplier, receptive of the response of said first digital filter as its multiplicand signal and receptive of the digitized samples of said wave of said submultiple frequency advanced in phase from said sine wave of said submultiple frequency as its multiplier signal, for generating a third product signal;

a fourth digital multiplier, receptive of the response of said second digital filter as its multiplicand signal and receptive of the digitized samples of said wave of said submultiple frequency advanced in phase from said cosine wave of said submultiple frequency as its multiplier signal, for generating a fourth product signal; and a first digital adder additively combining said third and fourth product signals for generating a first sum signal supplied as said fullband digital in-phase synchronous detection result.

50. A radio receiver as set forth in claim 49, further comprising
   a symbol synchronizer responsive to said fullband digital in-phase synchronous detection result for generating said symbol phase correction, which said symbol synchronizer comprises:
   a fifth digital filter, clocked at said sample rate, for supplying a mean-square-error gradient detection response to said digital in-phase synchronous detection result;
   a quantizer responding to said digital in-phase detection result to generate the closest one of the signal levels in said symbol codes as a quantizer output signal;
   a second digital subtractor for supplying a second difference signal indicative of the departure of each sample of said quantizer output signal from the sample of said digital in-phase detection result generating said sample of quantizer output signal;
   means for generating a product signal by multiplying samples of said second difference signal by corresponding samples of said mean-square-error gradient detection response for generating indications of symbol timing error;
   means for integrating said indications of symbol timing error over prescribed time interval to generate an integrated symbol timing error signal; and
   means responsive to said integrated symbol timing error signal for applying said symbol phase correction to said means for generating read-only memory addressing.

51. A radio receiver as set forth in claim 50, further comprising:
   means synchronously detecting, in accordance with the digital descriptions of said in-phase carrier of said submultiple frequency, just said pilot carrier component of said digitized final intermediate frequency signal for generating a DC digital in-phase synchronous detection result; and
   means for controlling the operation of said quantizer in response to said DC digital in-phase synchronous detection result.

52. A radio receiver as set forth in claim 51, wherein said means for generating said DC digital in-phase detection result comprises, in addition to said means for generating said fullband digital in-phase synchronous detection result, a lowpass fifth digital filter for selecting said DC digital in-phase synchronous detection result from said fullband digital in-phase synchronous detection result.

53. A radio receiver as set forth in claim 51, wherein said means for generating said DC digital in-phase synchronous detection result comprises, in addition to said first and second digital filters, the following:
   a fifth digital multiplier, receptive of the response of said third digital filter as its multiplicand signal and receptive of the digitized samples of said sine wave of said submultiple frequency as its multiplier signal, for generating a fifth product signal;
   a sixth digital multiplier, receptive of the response of said fourth digital filter as its multiplicand signal and receptive of the digitized samples of said cosine wave of said submultiple frequency as its multiplier signal, for generating a sixth product signal;
   a second digital adder additively combining said fifth and sixth product signals for generating a second sum signal; and
   a digital lowpass filter for supplying said DC digital in-phase synchronous detection result in response to said second sum signal.

54. A radio receiver as set forth in claim 1, wherein said means for controlling the rate of the recurrent pulses in said sample clock signal supplied by said sample clock generator comprises:
   a first bandpass digital filter for generating digital samples descriptive of selected portions of said fullband digital in-phase synchronous detection result that are at frequencies equal to and substantially equal to said symbol frequency;
   a digital multiplier means connected for squaring the digital samples generated by said first digital bandpass filter to generate a first product signal;
   a second bandpass digital filter for generating digital samples descriptive of selected portions of said first product signal that are at frequencies equal to and substantially equal to twice said symbol frequency; and
   means for locking the rate of the recurrent pulses in said sample clock signal supplied by said sample clock generator to said frequencies equal to and substantially equal to twice said symbol frequency described by the digital samples generated by said second bandpass digital filter.

55. A radio receiver as set forth in claim 54; wherein said sample clock generator comprises
   a controlled oscillator for generating oscillations at a frequency determined by said second automatic frequency and phase control signal, and
   means responsive to said oscillations for generating said sample clock signal comprising recurrent pulses supplied at a controlled rate; and wherein said means for locking the rate of the recurrent pulses in said sample clock signal supplied by said sample clock generator to said frequencies equal to and substantially equal to twice said symbol frequency described by the digital samples generated by said second bandpass digital filter comprises
   a digital-to-analog converter for converting the digital samples generated by said second bandpass digital filter to an analog signal, and
   a frequency and phase detector comparing the oscillations from said controlled oscillator to the analog signal from said digital-to-analog converter for generating said second automatic frequency and phase control signal.

* * * * *